US012607938B2

(12) United States Patent
Hartgers et al.

(10) Patent No.: US 12,607,938 B2
(45) Date of Patent: Apr. 21, 2026

(54) IMAGING SYSTEM

(71) Applicant: ASML NETHERLANDS B.V., Veldhoven (NL)

(72) Inventors: Albertus Hartgers, Berkel-Enschot (NL); Marco Matheus Louis Steeghs, Sevenum (NL); Gerardus Hubertus Petrus Maria Swinkels, Eindhoven (NL); Giovanni Imponente, Eindhoven (NL); Nicholas William Maria Plantz, Tilburg (NL); Wouter Joep Engelen, Eindhoven (NL); Marcus Adrianus Van De Kerkhof, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 196 days.

(21) Appl. No.: 18/565,200

(22) PCT Filed: Jun. 20, 2022

(86) PCT No.: PCT/EP2022/066669
§ 371 (c)(1),
(2) Date: Nov. 29, 2023

(87) PCT Pub. No.: WO2022/268679
PCT Pub. Date: Dec. 29, 2022

(65) Prior Publication Data
US 2024/0361698 A1 Oct. 31, 2024

(30) Foreign Application Priority Data
Jun. 22, 2021 (EP) ..................................... 21180749

(51) Int. Cl.
*G03F 7/20* (2006.01)

(52) U.S. Cl.
CPC .................................. *G03F 7/2002* (2013.01)

(58) Field of Classification Search
CPC ............................... G03F 7/2002; G03F 7/706
See application file for complete search history.

(56) References Cited

U.S. PATENT DOCUMENTS

2002/0171922 A1 11/2002 Shiraishi et al.
2004/0156041 A1* 8/2004 Shiode .................... G03F 7/706
356/124.5

(Continued)

FOREIGN PATENT DOCUMENTS

JP 2005311296 11/2005
WO 2016/169890 10/2016
WO 2019/149468 8/2019

OTHER PUBLICATIONS

Translation of JP 2005311296, 2005-11.*

(Continued)

*Primary Examiner* — Peter B Kim

(74) *Attorney, Agent, or Firm* — Pillsbury Winthrop Shaw Pittman, LLP

(57) ABSTRACT

A plate for use in an imaging system to determine at least two optical properties of an illumination beam of the imaging system, the imaging system configured to illuminate an illumination region with the illumination beam, the plate including a plurality of markers, wherein a first subset of the plurality of markers includes a first type of markers for determining a first optical property of the illumination beam, and a second subset of the plurality of markers includes a second type of markers for determining a second optical property of the illumination beam, wherein the plurality of markers are located within a marker region of the plate and the marker region generally corresponds to the illumination region.

20 Claims, 6 Drawing Sheets

(56) References Cited

U.S. PATENT DOCUMENTS

| 2005/0146704 | A1* | 7/2005 | Gruner | ............... G03F 7/70566 |
| | | | | 355/71 |
| 2006/0250607 | A1 | 11/2006 | Takahashi | |
| 2009/0195764 | A1 | 8/2009 | Takenada | |
| 2018/0088467 | A1* | 3/2018 | Baselmans | .......... G03F 7/70866 |

OTHER PUBLICATIONS

International Search Report and Written Opinion issued in corresponding PCT Patent Application No. PCT/EP2022/066669, dated Sep. 30, 2022.

* cited by examiner

IMAGING SYSTEM

CROSS-REFERENCE TO RELATED APPLICATIONS

This application is the U.S. national phase of PCT Patent Application No. PCT/EP2022/066669 which was filed on Jun. 22, 2021, which claims priority of European Patent Application No. 21180749.0 which was filed on Jun. 22, 2021 and which is incorporated herein in its entirety by reference.

FIELD

The present invention relates to an imaging system and, in particular, to apparatus and methods for determining one or more optical properties of the imaging system. The imaging system may form part of a lithographic apparatus

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate. A lithographic apparatus comprises an imaging system which images a pattern at the patterning device onto a plane containing the substrate. In particular, radiation that has been patterned by the patterning device can be focused onto the substrate using a projection system.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Radiation provided to the patterning device has a range of optical properties. For example, the radiation may have a particular angular distribution, which may be referred to as a pupil shape. The projection system may introduce optical aberrations, which cause the image formed on the substrate to deviate from a desired image (for example a diffraction limited image of the patterning device). Optical aberrations may be considered another type of optical property of the radiation. Knowledge of optical properties of the radiation may allow for better control of the radiation and/or optimisation of a lithographic process.

It may be desirable to provide methods and apparatus for accurately determining optical properties such as the pupil shape and optical aberrations.

SUMMARY

In an example described herein there is an imaging system comprising a first plane configured to receive an illumination beam in a first region, a second plane configured to receive, in a second region of the second plane, an image of the first region and a first plate comprising a first plurality of markers and a second plate comprising a second plurality of markers. A first subset of the first plurality of markers comprises a first type of markers for determining a first optical property of the illumination beam. A second subset of the first plurality of markers comprises a second type of markers for determining a second optical property of the illumination beam. The first plate is positionable in the first plane such that the first plurality of markers are located within the first region. A first subset of the second plurality of markers comprises a first type of markers for determining the first optical property of the illumination beam. A second subset of the second plurality of markers comprises a second type of markers for determining the second optical property of the illumination beam. The arrangement of the second plurality of markers generally matches the arrangement of the first plurality of markers. The second plate is positionable in the second plane such that the second plurality of markers are located within the second region. The imaging system further comprises a detector positionable in a third plane. The detector is operable to receive radiation from the second plate when the second plate is disposed in the second region and output a signal indicative of the first and/or second optical properties of the illumination beam.

Such an arrangement enables the first and second optical properties of the illumination beam to be determined substantially simultaneously. That is, the illumination beam may illuminate the first plurality of markers in the first plane and enable both the first and second optical property of the illumination beam to be determined without needing to move either the first plate or the illumination beam. This may lead to a significant time saving compared to determining the first and second optical properties in two separate measurements.

The imaging system may be a lithographic system that may be used for forming an image of a reticle on a substrate (for example a resist coated silicon wafer). The first plane may be referred to as an object plane. The first plane may be a plane in which a reticle may be positioned during exposure of a substrate. The first plane may be referred to as being at reticle level and an object disposed in the first plane may be referred to as being at reticle level. The second plane may be referred to as an image plane. The second plane may be a plane in which a substrate may be positioned during exposure of the substrate. The second plane may be referred to as being at substrate level and an object disposed in the second plane may be referred to as being at substrate level.

The first region may be referred to as an illumination region, a slit, an illumination slit or an exposure slit. The first region may be referred to as a reticle level slit. Similarly, the second region may be referred to as a slit, an illumination slit or an exposure slit. The second region may be referred to as a substrate level slit.

The illumination beam may be generated by an illumination system, which may also comprise part of the imaging system. The imaging system may further comprise imaging means, for example a projection system, operable to form an image of the first region at the second region.

In general, the first and second regions may be elongate, each having a longer dimension and a shorter dimension. The first and second regions may be curved or straight. The shorter dimension may coincide with a scanning direction of the imaging system and the longer dimension may coincide with a non-scanning direction of the imaging system.

The arrangement of the second plurality of markers generally matching the arrangement of the first plurality of markers is intended to mean that the first plurality of markers and the second plurality of markers are arranged in substantially the same configuration. In particular, the arrangement of the second plurality of markers generally matching the arrangement of the first plurality of markers may mean that the a spatial ordering of the first and second types of marker within the first plurality of markers and a spatial ordering of the first and second types of marker within the second plurality of markers may be the same. For example, the number of markers in the first subset of the first plurality of markers may be the same as the number of markers in the first subset of the second plurality of markers; the number of markers in the second subset of the first plurality of markers may be the same as the number of markers in the second subset of the second plurality of markers; and a spatial ordering of the first and second types of marker within the first plurality of markers may be the same as that within the second plurality of markers. In use, the first plate may be positioned such that an illumination beam generated by the illumination system is received by the first plate at the first region and forms and image of the first plurality of markers at the second region. The illumination beam which contains an image of the first plurality of markers may be referred to as a patterned illumination beam. In use, the second plate is positionable such that the images of each of the first plurality of markers formed in the second region coincide with a corresponding one of the second plurality of markers. That is, the first and second plate may be arranged in a conjugate arrangement.

For the avoidance of doubt, the first plate comprising a first plurality of markers and the second plate comprising a second plurality of markers and the arrangement of the second plurality of markers generally matching the arrangement of the first plurality of markers does not preclude there being additional markers on either the first or second plates. For example, in some embodiments, the second plate may comprise additional markers that have an arrangement generally matching the arrangement of a plurality of markers on another plate that is separately positionable in the first plane such that these plurality of markers on this other plate can be located within the first region.

The second plate being disposed in the second region is intended to mean that the second plate is disposed in the second region such that the second plurality of markers are located within the second region. It can be said that the detector receives radiation from the second plurality of markers when the second plate is thus arranged. The second plate may be affixed to, or may form part of, the detector.

The signal may comprise information relating to at least one optical property of a radiation beam of the illumination system which illuminates the first region and/or second region. The optical property may be related to one or more properties of an illumination system of the imaging system, for example a pupil shape of illumination at the first plane. Additionally, the optical property may be related to one or more properties of the projection system, for example aberrations induced by the means of imaging from the first plane to the second plane, for example by a projection system. Aberrations induced by the imaging means can be determined by determining an aberration map of the illumination beam in the second plane.

In some embodiments, the first plurality of markers may be simultaneously positionable within the first region. As used here, simultaneously positionable is intended to mean that all of the first plurality of markers can be located in the first region simultaneously. That is, all of the markers can be illuminated at the same time, without moving the markers. Similarly, in some embodiments, the second plurality of markers may be simultaneously positionable within the second region. As used here, simultaneously positionable is intended to mean that all of the second plurality of markers can be located in the second region simultaneously. That is, all of the markers can be illuminated at the same time, without moving the markers.

The markers may be matched in a first direction of the first and second plates. The markers may either be matched or unmatched in a second direction of the first and second plates, when the plates are positioned in use, as now discussed.

The arrangement of the second plurality of markers may generally match the arrangement of the first plurality of markers such that, when the first plate is disposed in the first region and the second plate is disposed in the second region, an image of each of the first plurality of markers coincides with a corresponding one of the second plurality of markers in a first direction.

The first plate being disposed in the first region is intended to mean that the first plate is disposed in the first region such that the first plurality of markers are located within the first region.

The first direction may correspond to a longer dimension of the first and second regions. The first direction may correspond to a non-scanning direction of the imaging system. With such an arrangement, the image of each of the first plurality of markers can be projected onto the corresponding one of the second plurality of markers by relative movement of first and second plates in a second direction that is perpendicular to the first direction. The image of the first plurality of markers may be formed by a projection system.

The arrangement of the second plurality of markers may generally match the arrangement of the first plurality of such that, when the first plate is disposed in the first region and the second plate is disposed in the second region, an image of each of the first plurality of markers coincides with a corresponding one of the second plurality of markers.

That is, the image of each of the first plurality of markers coincides with a corresponding one of the second plurality of markers in a first direction and a second direction perpendicular to the first direction. Such an arrangement does not require any relative movement of the first and second plates to image all of the first plurality of markers onto all of the second plurality of markers. As such, all corresponding pairs of reticle level and substrate level markers can be used to determine an optical property of the illumination beam simultaneously. The image of the first plurality of markers may be formed by a projection system.

The configurations of first and second plate may be identical. That is, the arrangement of the first plurality of markers may be identical to the second plurality of markers. Alternatively, and for example if a scaling is applied to the imaging between the first and second planes, the arrangement of markers on the first plate may be a scaled version of the arrangement of markers on the second plate.

The first optical property may be an aberration map of the illumination beam (which may, for example, characterize aberrations introduced by a projection system than images the first region onto the second region). Each of the first type of markers may comprise a grating.

The aberration map may comprise a representation of one or more aberrations in the illumination beam. The one or more aberrations may be imparted to the illumination beam by a projection system. As such, the first optical property may represent an aberration map of the projection system. The one or more aberrations may be measured, for example, with reference to one or more orders of Zernike aberrations.

Use of a grating may enable the determination of an aberration status from an illumination beam which has interacted with the grating.

The second optical property may be an angular distribution of the illumination beam at the first region. Each of the second type of markers may comprise a pinhole.

The angular distribution may correspond to a shape or intensity profile of the illumination beam. The angular distribution may be referred to as a pupil shape. The use of a pinhole may enable the determination of a shape of an angular distribution of an illumination beam which has interacted with the pinhole.

The imaging system may further comprise a third plurality of markers positionable in the first plane. A first subset of the third plurality of markers may comprise a first type of markers for determining a first optical property of the illumination beam. A second subset of the third plurality of markers may comprise a second type of markers for determining a second optical property of the illumination beam. The third plurality of markers may be positionable within the first region. The configuration of the third plurality of markers may be different to the configuration of the first plurality of markers. The imaging system may further comprise a fourth plurality of markers positionable in the second plane. A first subset of the fourth plurality of markers may comprise a first type of markers for determining a first optical property of the illumination beam. A second subset of the fourth plurality of markers may comprise a second type of markers for determining a second optical property of the illumination beam. The fourth plurality of markers may be positionable within the second region. The arrangement of the fourth plurality of markers may generally match the arrangement of the third plurality of markers.

In some embodiments, the third plurality of markers may be simultaneously positionable within the first region. As used here, simultaneously positionable is intended to mean that all of the third plurality of markers can be located in the first region simultaneously. That is, all of the markers can be illuminated at the same time, without moving the markers. Similarly, in some embodiments, the fourth plurality of markers may be simultaneously positionable within the second region. As used here, simultaneously positionable is intended to mean that all of the fourth plurality of markers can be located in the second region simultaneously. That is, all of the markers can be illuminated at the same time, without moving the markers.

The various pluralities of markers may be positionable at a set of field points within the first and second regions. For example, the first and second plurality of markers may sample substantially the same set of field points as the third and fourth plurality of markers, but the arrangement or configuration of the first and second type of markers within the first and second plurality of markers may be different to the arrangement or configuration of the first and second type of markers within the third and fourth plurality of markers. Such an arrangement enables the sampling of the first optical property at a first set of field points and the second optical property at a second set of field points when using the first and second plurality of markers, and enables, for example, the sampling of the first optical property at the second set of field points and the first optical property at the first set of field points when using the third and fourth plurality of markers. As such, information obtained for a particular field point may be alternated with relative ease. Furthermore, by alternating between the first and second plurality of markers and the third and fourth plurality of markers, information relating to the first optical property can be obtained for every field point using only two measurements. Similarly, information relating to the second optical property can be obtained for every field point using only two measurements.

The imaging system may further comprise additional pluralities of markers, for example a fifth and sixth plurality of markers wherein the configuration of the fifth plurality of markers is different to the configuration of the first plurality of markers and the configuration of the third plurality of markers, and the arrangement of the sixth plurality of markers generally matches the arrangement of the fifth plurality of markers.

The first plate may further comprise the third plurality of markers. The first plate may be further positionable such that the third plurality of markers are located within the first region. The second plate may further comprise the fourth plurality of markers. The second plate may be further positionable such that the fourth plurality of markers are located within the second region.

For example, each of the first and second plate may comprise two sets of markers. By positioning the first and second plate differently within the first and second plane, either the first and second plurality of markers may be used to determine the first and/or second optical property, or the third and fourth plurality of markers may be used to determine the first and/or second optical property. Such an apparatus enables easy alternation between the different arrangements of markers by making a relatively small positional change of the first and second plates.

The imaging apparatus may further comprise a third plate comprising the third plurality of markers, the third plate being positionable in the first plane such that the third plurality of markers are located within the first region. Additionally or alternatively, the imaging apparatus may further comprise a fourth plate comprising the fourth plurality of markers, the fourth plate being positionable in the second plane such that the fourth plurality of markers are located within the second region.

That is, an additional set of plates may be provided to the imaging apparatus so as to provide the alternative arrangement of markers. Such an apparatus may beneficially enable a single plate to be replaced, for example if it becomes contaminated, without requiring other plates to be replaced.

In another example described herein there is a lithographic apparatus comprising the imaging apparatus as described above. The lithographic apparatus further comprises an illumination system operable to illuminate the first region with an illumination beam and a projection system operable to form an image of the first region at the second region.

A lithographic apparatus may particularly benefit from the simultaneous determination of the first and second optical property. For example, a simultaneously determination of two optical properties may enable optimization of a lithographic process without a significant time loss, leading to increased throughput and/or increased performance of the lithographic process.

The lithographic apparatus may use EUV radiation, that is the illumination beam may comprise EUV radiation. The first and/or second type of markers may comprise markers operable to interact with EUV radiation. Such markers may comprise reflective markers, for example a reflective grating. In one embodiment, the markers provided at reticle level (i.e. in the first plane) may be reflective and the markers provided at substrate level (i.e. in the second plane) may be transmissive.

In another example described herein there is a method of determining one or more optical properties of the imaging system described above. The method comprises positioning the first plate in the first plane such that the first plurality of markers are located within the first region, positioning the second plate in the second plane such that the second plurality of markers are located within the second region, illuminating the first region with an illumination beam, receiving, with the detector, radiation from the second plate, receiving, from the detector, the signal indicative of the first and/or second optical properties of the illumination beam, and determining the first and/or second optical properties of the illumination beam based on the signal.

Determining the first and/or second optical properties may be performed by a processor, for example a processor of a computer. The processor may form part of the imaging system or may be part of an external computing system.

In another example described herein there is a plate for use in an imaging system to determine two optical properties of an illumination beam of the imaging system, the imaging system configured to illuminate an illumination region with the illumination beam. The plate comprises a plurality of markers. A first subset of the plurality of markers comprises a first type of markers for determining a first optical property of the illumination beam. A second subset of the plurality of markers comprises a second type of markers for determining a second optical property of the illumination beam. The plurality of markers are located within a marker region of the plate. The marker region generally corresponds to the illumination region.

The plate may be a fiducial plate. That is, the plate may be for use in an object plane of the imaging system. The plate may have particular application in a lithographic apparatus. In particular, the plate may for use at reticle level as a fiducial plate.

In some embodiments, a space between adjacent markers from the plurality of markers may be larger than a dimension of each of the plurality of markers.

The marker region generally corresponding to the illumination region is intended to mean that the plate can be positioned in a plane comprising the illumination region such that the entire marker region is illuminated by the illumination beam. The marker region and the illumination region have a similar or identical size and shape. The marker region may be of a similar size to the illumination region but be smaller than the illumination region, for example the marker region may be a scaled version of the illumination region. The markers may be discrete markers arranged within the marker region of the plate.

Such an arrangement enables the first and second optical properties of the illumination beam to be determined substantially simultaneously. That is, the illumination beam may illuminate the plurality of markers in the illumination region and enable both a first and second optical property of the illumination beam to be determined without needing to move either the plate or the illumination beam. This may lead to a significant time saving compared to determining the first and second optical properties in two separate measurements.

The plate may be used with the imaging system or lithographic apparatus of any of the above described examples, for example the plate may be used as the first plate and/or the second plate of the above described examples.

Each of the first type of markers may comprise a grating.

The use of a grating may enable the determination of one or more aberrations in an imaging system. The one or more aberrations may be measured, for example, with reference to one or more orders of Zernike aberrations. One of the optical properties to be determined may be related to aberrations, for example the optical property may comprise an aberration map of a portion of the imaging system. For example, an aberration map of a projection system of the imaging system may be determined.

Each of the second type of markers may comprise a pinhole.

The use of a pinhole may enable the determination of an angular distribution of the illumination beam at the illumination region. The angular distribution may be referred to as a pupil shape. The angular distribution may correspond to a shape and/or intensity profile of the illumination beam in a pupil plane of an imaging system.

The marker region may be elongate. That is, the marker region has a size in a first direction and a second direction, and the size of the marker region in the first direction may be greater than the size in the second direction. Similarly, the illumination region may have a similarly elongate shape with a first and second direction wherein the size of the illumination region in the first direction is greater than the size in the second direction. The size (of the marker region and/or the illumination region) in the first direction may hence be referred to as a longer dimension. The size (of the marker region and/or the illumination region) in the second direction may hence be referred to as a shorter dimension. The shorter dimension may coincide with a scanning direction of the imaging system and the longer dimension may coincide with a non-scanning direction of the imaging system. The plate may be positioned in the plane of the imaging system (i.e. the plane in which the illumination region is located) such that the shorter dimension of the marker region is generally aligned with the shorter dimension of the illumination region and the longer dimension of the marker region is generally aligned with the longer dimension of the illumination region. The marker region may be curved or straight.

In some applications, for example lithography, the illumination region is elongate. As such, it may be beneficial to arrange markers in a marker region which is similarly elongate such that all the markers may be illuminated simultaneously.

A first marker of the plurality of markers may be located at, or proximate to, a first end of the marker region. A second marker of the plurality of markers may be located at, or proximate to, a second end of the marker region distal to the first end. The other markers of the plurality of markers may be distributed between the first and second marker.

The first and second ends of the elongate region may represent the distal ends of the elongate region in the longest dimension. By arranging the markers in this way, the markers are distributed across substantially all of the marker region. As such, a set of field points may be sampled that are distributed across substantially all of the illumination region. Beneficially, this enables the two optical properties to be determined over substantially the whole illumination region.

The first marker, other markers and second marker may be distributed along a first direction, for example the direction of the longest dimension for an elongate region. That is, for an elongate marker region, the plurality of markers may be generally distributed along the longer dimension of the elongate region.

The other plurality of markers may be generally evenly distributed between the first marker and the second marker. That is, the distance between adjacent markers, for example in the first direction, may be substantially equal.

Adjacent markers of the plurality of markers may alternate between the first type of marker and the second type of marker.

The plurality of markers may alternate between the first type of marker and the second type of marker along the first direction, for example the direction of the longest dimension for an elongate marker region. By alternating between different types of marker within the marker region, each type of marker may be distributed across substantially all of the marker region. Beneficially, this enables the two optical properties to be determined over substantially all of the illumination region. It should be understood that the illumination region has an infinite number of field points, not all of which are sampled, but that interpolation (or other similar methods) can be used between adjacent pairs of the same type of marker to determine an optical property over substantially all of the illumination region.

In another example described herein there is a plate system for use in an imaging system to determine two optical properties of an illumination beam of the imaging system, the imaging system configured to illuminate an illumination region with the illumination beam. The plate system comprises a first plate and second plate each according to the plates described above. On the first plate, the first subset of the plurality of markers are located at a set of first locations and the second subset of the plurality of markers are located at a set of second locations. On the second plate, the first subset of the plurality of markers are located at a set of second locations and the second subset of the plurality of markers are located at a set of first locations. The first locations of the first plate correspond to the first locations of the second plate and the second locations of the first plate correspond to the second locations of the second plate.

Such an arrangement may be referred to as being arranged in reciprocal fashion, a reciprocal arrangement or a complementary arrangement. The plurality of markers on the first plate may be referred to as a first plurality of markers. The plurality of markers on the second plate may be referred to as a second plurality of markers. When the first plate is in use, it can be positioned in a plane comprising the illumination region such that the first plurality of markers are illuminated. Alternatively, in use the second plate can be positioned in the plane comprising the illumination region such that the second plurality of markers are illuminated. When the first plate is in use, a first set of field points corresponding to the set of first locations are able to be sampled with respect to the first optical property and a second set of field points corresponding to the set of second locations are able to be sampled with respect to the second optical property. When the second plate is in use, a first set of field points corresponding to the set of first locations are able to be sampled with respect to the second optical property and a second set of field points corresponding to the set of second locations are able to be sampled with respect to the first optical property. In this way, each optical property can be sampled at every location (i.e. comprising the first and second locations) in only two measurements. Such a plate system may enable a large amount of information to be gained regarding the optical properties of the illumination beam with a high frequency. For example, every field point which corresponds to a first or second location may be probed for two different optical properties by taking two measurements, first with the first plate in use, and second with the second plate in use. Additionally, a determination of the two optical properties may be determined in a single measurement (e.g. with either the first or the second plurality of markers in use), where this determination is less precise than a determination over two measurements, but can be made with increased frequency.

Such a plate system may yield a further benefit that, if a plate (e.g. the first or second plate) becomes damaged or contaminated, the other plate can still be used to determine two optical properties.

The first and second plates may be unitary. That is, the plate system may comprise a single plate which comprises both the first and second plurality of markers.

The plate system may be used with the imaging system or lithographic apparatus of any of the above described examples.

In another example described herein there is a plate system for use in an imaging system to determine two optical properties of an illumination beam of the imaging system. The plate system comprises a first plate, a second plate, and a third plate each according to the plates described above. On the first plate, the first subset of the plurality of markers are located at a set of first locations, the second subset of the plurality of markers are located at a set of second locations. The first plate further comprises a set of third locations which comprise no markers. On the second plate, the first subset of the plurality of markers are located at a set of second locations and the second subset of the plurality of markers are located at a set of third locations. The second plate further comprises a set of first locations which comprise no markers. On the third plate, the first subset of the plurality of markers are located at a set of third locations, the second subset of the plurality of markers are located at a set of first locations. The third plate further comprises a set of second locations which comprise no markers. The first locations of the first plate correspond to the first locations of the second plate and the first locations of the third plate. The second locations of the first plate correspond to the second locations of the second plate and the second locations of the third plate. The third locations of the first plate correspond to the third locations of the second plate and the third locations of the third plate.

Within an EUV lithographic apparatus, some parts of the apparatus may be subject to contamination, for example, in the presence of EUV radiation from the source of the illumination beam. Parts of the apparatus at substrate level may be particularly susceptible to such contamination. Markers at reticle level, for example gratings and pinholes, may permit onward travel of the illumination beam to wafer level. Contamination of markers at substrate level which may cause a reduction in the accuracy with which aberrations and pupil shape may be determined and/or may necessitate cleaning and/or replacement of elements. By providing n plates, each plate may be used 1/n th of the time and some of the locations on the plates can comprise no markers. This can reduce the amount of contamination which each wafer level marker is subject to.

By providing locations which comprise no markers in a plate system as described herein, wherein the locations have no marker on a first plate but have different types of markers on other plates, contamination can be reduced while still enabling the determination of optical properties at relevant field points (i.e. corresponding to the first, second and third locations). Each time a different plate of the three plates is used, a different set of locations (i.e. the set of first, second or third locations) is shielded from contamination while the other two sets of locations are sampled. This may provide a beneficial tradeoff between collecting information for determining optical properties while also reducing contamination.

Regions with no markers may be referred to as blanks. Such an arrangement of the first type of marker, second type of marker and blanks on different plates may be referred to as being arranged in reciprocal fashion, a reciprocal arrangement or a complementary arrangement.

In another example described herein there is a plate system for use in an imaging system to determine an optical property of an illumination beam of the imaging system, the imaging system configured to illuminate an illumination region with the illumination beam, the plate system comprising a first plate and a second plate. The first plate comprises a first plurality of markers for determining the optical property of the illumination beam, the first plurality of markers located at a set of first locations and a set of second locations which comprise no markers. The second plate comprises a second plurality of markers for determining the optical property of the illumination beam, the second plurality of markers located at a set of second locations which correspond to the set of second locations of the first plate and a set of first locations which comprise no markers. The set of first locations of the second plate corresponds to the set of first locations of the first plate. The first plurality of markers are located in a first marker region which generally corresponds to the illumination region. The second plurality of markers are located in a second marker region which generally corresponds to the illumination region.

Within an EUV lithographic apparatus, some parts of the apparatus may be subject to contamination, for example, in the presence of EUV radiation from the source of the illumination beam. Parts of the apparatus at substrate level may be particularly susceptible to such contamination. Markers at reticle level, for example gratings and pinholes, may permit onward travel of the illumination beam to wafer level. Contamination of markers at substrate level which may cause a reduction in the accuracy with which aberrations and pupil shape may be determined and/or may necessitate cleaning and/or replacement of elements. By providing plates wherein some of the locations on the plates comprise no markers, the amount of contamination which each wafer level marker is subject to can be reduced.

By providing locations which comprise no markers in a plate system as described herein, wherein the locations have no marker on a first plate but have different types of markers on other plates, contamination can be reduced while still enabling the determination of an optical property at relevant field points (i.e. corresponding to the first and second locations). Each time a different plate is used, a different set of locations (i.e. the set of first or second locations) is shielded from contamination while the other set of locations are sampled. This may provide a beneficial tradeoff between collecting information for determining optical properties while also reducing contamination.

Regions with no markers may be referred to as blanks. Such an arrangement of the first type of marker, second type of marker and blanks on different plates may be referred to as being arranged in reciprocal fashion, a reciprocal arrangement or a complementary arrangement.

Such a plate system may yield a further benefit that, if a plate (e.g. the first or second plate) becomes damaged or contaminated, the other plate can still be used to determine the optical property.

The first and second plates may be unitary. That is, the plate system may comprise a single plate which comprises both the first and second plurality of markers.

The marker region generally corresponding to the illumination region is intended to mean that the plate can be positioned in a plane comprising the illumination region such that the entire marker region is illuminated by the illumination beam. The marker region and the illumination region have a similar or identical size and shape. The marker region may be of a similar size to the illumination region but be smaller than the illumination region, for example the marker region may be a scaled version of the illumination region. The markers may be discrete markers arranged within the marker region of the plate.

The plate system may be used with the imaging system or lithographic apparatus of any of the above described examples.

In another example described herein there is a reticle stage for holding a reticle. The reticle stage comprises any of the plates or plate systems described above.

Such a plate or a plate system can be used at a reticle stage to determine one or more optical properties of an illumination beam illuminating a portion (i.e. the illumination region) of a reticle. It may be beneficial to determine optical properties of the illumination beam at the reticle, for example so corrective measures can be performed to improve the quality of a pattern imparted to the illumination beam by the reticle. The correction may be an adjustment to the shape and/or intensity profile of the illumination beam. The correction may be an adjustment to change the aberration status of the illumination beam.

The plate or plate system may be mounted on the reticle stage. The reticle stage may be movable so as to move the plate or plate system into and out of a position wherein the plurality of markers are illuminated by the illumination beam.

The reticle stage may form part of the imaging system or lithographic apparatus of any of the above described example. The reticle stage may be positioned at a reticle level of such an imaging system or lithographic apparatus.

In another example described herein there is a substrate stage for holding a substrate. The substrate stage comprises any of the plates or plate systems described above.

Such a plate or plate system can be used at a substrate stage to determine one or more optical properties of an illumination beam illuminating (and optionally patterning) a portion of a substrate. It may be beneficial to determine optical properties of the illumination beam at the substrate, for example so corrective measures can be performed to improve the quality of a pattern illuminated on the substrate. The correction may be an adjustment to the shape and/or intensity profile of the illumination beam. The correction may be an adjustment to change the aberration status of the illumination beam. The correction may be an adjustment to one or more elements of a projection system configured to image from a first plane of an imaging system to a second plane of an imaging system.

The plate may be mounted on the wafer stage. The wafer stage may be movable so as to move the plate into and out of a position wherein the plurality of markers are illuminated by the illumination beam.

The substrate stage may form part of the imaging system or lithographic apparatus of any of the above described example. The substrate stage may be positioned at a substrate level of such an imaging system or lithographic apparatus.

In another example described herein there is a detector comprising any of the plates or plate systems described above.

The plate portion of the detector may be arranged such that, when the markers of the plate or plate system are illuminated by an illumination beam, the detector can receive radiation from the plate and output a signal indicative of one or more optical properties of the illumination beam. The plate portion of the detector may be arranged in a second plane and a radiation receiving portion of the detector may be arranged in a third plane. The second and third planes may be parallel. Optionally, the detector may comprise optics configured to direct radiation from the second plane to the third plane.

BRIEF DESCRIPTION OF THE DRAWINGS

Example implementations of the invention will now be described, by way of example only, with reference to the accompanying drawings, in which.

These figures are schematic in nature and are not to scale.

DETAILED DESCRIPTION

Figure 1:
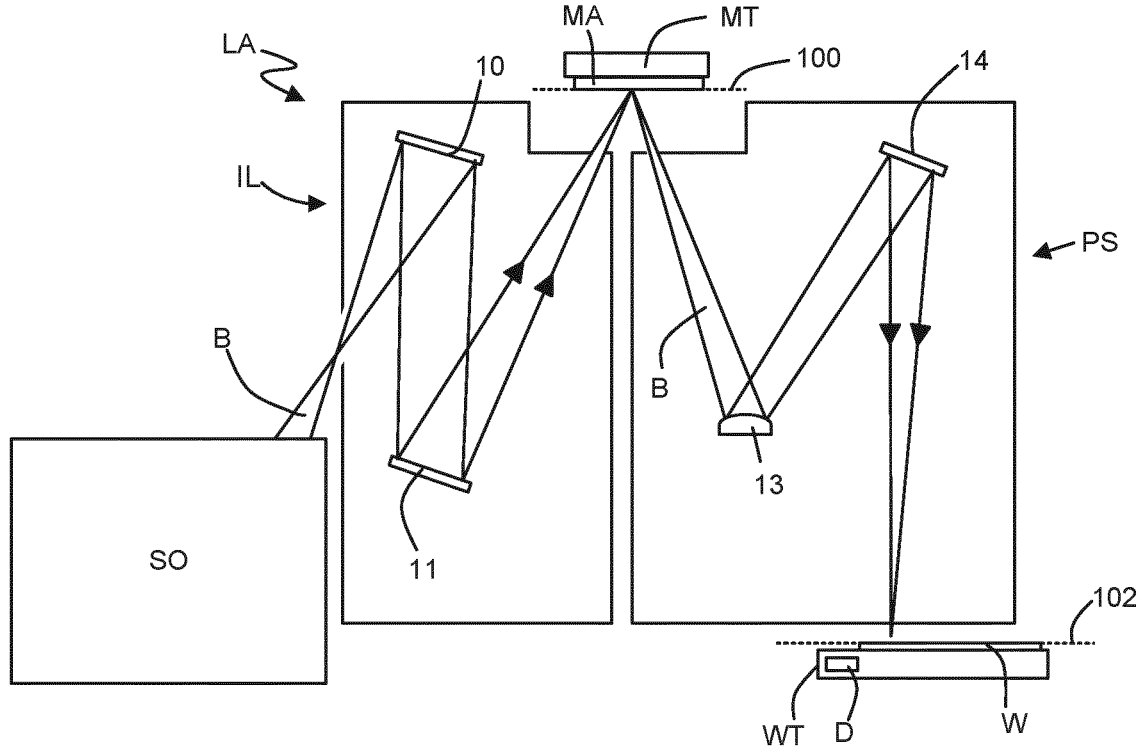
FIG. 1 shows a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The radiation beam B may be referred to as an illumination beam. The lithographic apparatus LA comprises an illumination system IL, a support structure MT configured to support a patterning device MA (e.g., a mask), a projection system PS and a substrate table WT configured to support a substrate W. The patterning device MA may be referred to as a reticle. The support structure MT is configured to hold a reticle MA in a reticle plane 100 of the lithographic apparatus LA. The reticle plane 100 may be referred to an object plane of the lithographic apparatus LA. The reticle plane 100 may be referred to as being at reticle level. The substrate table WT is configured to hold a substrate W in a substrate plane 102 of the lithographic apparatus LA. The substrate plane 102 may be referred to as an image plane of the lithographic apparatus LA. The substrate plane 102 may be referred to as being at substrate level. The projection system PS is configured to form an image of an object in the reticle plane 100 in the substrate plane 102. As such, the reticle plane 100 and substrate plane 102 can be said to be conjugate planes. The reticle level (and components thereof, for example the support structure MT), the substrate level (and the components thereof, for example the substrate table WT) and the projection system PS may be considered to form an imaging system. The imaging system images using radiation from the illumination system IL. As such, the illumination system IL may also be said to comprise part of the imaging system.

A detector D is on the substrate table WT. The detector is disposed in another plane such that it is operable to receive radiation from the substrate plane 102 during an aberration or pupil measurement. In FIG. 1, the detector D is positioned below the substrate plane 102, such that is may receive radiation from a transmissive element held by the substrate table WT in substrate plane 102 (e.g. a transmissive grating or pinhole).

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape, a desired intensity distribution and a desired angular distribution. The angular distribution of the radiation beam B may be described by an intensity distribution in a pupil plane and may be referred to as a pupil shape. The illumination system IL may include other mirrors or devices in addition to, or instead of, the faceted field mirror device 10 and faceted pupil mirror device 11. For example, one or more blades (not shown) may be used to provide the radiation beam B with a cross-sectional shape. The blades may operate by intersecting the radiation beam B prior to the patterning device, wherein the position of the blades alters the cross-sectional shape of the radiation beam B. The blades may be moveable such that an overlap of the blades with the radiation beam B can be controlled. The radiation beam hence illuminates a region of the reticle plane 100, the shape of which depends on the shaping of the radiation beam B. The region on the reticle plane 100 (for example, the region of the patterning device MA) illuminated by the radiation beam B may be referred to as an illumination region.

After being thus conditioned, the EUV radiation beam B interacts with the patterning device MA. As a result of this interaction a patterned EUV radiation beam B' is generated. The projection system PS is configured to project the patterned EUV radiation beam B' onto the substrate W. That is, the projection system PS forms an image of an object disposed in the reticle plane 100 on the substrate plane 102, and by positioning a patterning device MA in the reticle plane 100 and a substrate W in the substrate plane, the projection system PS can be used to form an image of the reticle MT on the substrate W. For that purpose, the projection system PS may comprise a plurality of mirrors 13, 14 which are configured to project the patterned EUV radiation beam B' onto the substrate W held by the substrate table WT. The region of the substrate plane 102 (e.g. the region of the substrate W) that the patterned EUV radiation beam B' is projected onto may be referred to as an illumination region.

The projection system PS may apply a reduction factor to the patterned EUV radiation beam B' thus forming an image with features that are smaller than corresponding features on the patterning device MA. For example, a reduction factor of 4 or 8 may be applied. As such, the illumination region on the reticle plane 100 may be a scaled version of the illumination region on the substrate plane 102 (e.g. scaled by a reduction factor of, for example, 4 or 8). Alternatively, the illumination region on the reticle plane 100 may be equivalent in size and shape compared to the illumination region on the substrate plane 102, for example if no reduction factor is applied by the projection system PS. Although the projection system PS is illustrated as having only two mirrors 13, 14 in FIG. 1, the projection system PS may include a different number of mirrors (e.g. six or eight mirrors).

A relative vacuum, i.e. a small amount of gas (e.g. hydrogen) at a pressure well below atmospheric pressure, may be provided in the radiation source SO, in the illumination system IL, and/or in the projection system PS. The radiation source SO may be a laser produced plasma (LPP) source, a discharge produced plasma (DPP) source, a free electron laser (FEL) or any other radiation source that is capable of generating EUV radiation.

In general, the projection system PS has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, may be referred to as the transmission map and the aberration map. Transmission and aberration are examples of optical properties of the radiation beam B (or the patterned radiation beam B') which may be induced by the projection system PS.

The transmission and aberration maps be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Each Zernike coefficient relates to a different type of aberration, for example tilt (in an x-direction and a y-direction), astigmatism, coma, spherical aberration etc. Determining aberrations (which may be caused by the projection system or by placement errors of the patterning device or the substrate) may comprise fitting the measurements which are made by the detector to Zernike polynomials in order to obtain Zernike coefficients. Different Zernike coefficients may provide information about different forms of aberration which are caused by the projection system. It will be appreciated that in alternative implementations other sets of basis functions may be used. For example some embodiments may use Tatian Zernike polynomials, for example for obscured aperture systems.

The aberration map represents the distortions of the wavefront of light approaching a point in an image plane of the projection system PS (i.e. the substrate plane 102) from a spherical wavefront (as a function of position in the pupil plane or, alternatively, the angle at which radiation approaches the image plane of the projection system PS). Throughout this description the term "aberrations" should be intended to include all forms of deviation of a wavefront from a perfect spherical wavefront. Furthermore, any reference to an aberration map for a projection system may include all forms of deviation of a wavefront from a perfect spherical wavefront, including those due to image placement.

The transmission map and the aberration map are field and system dependent. That is, in general, each projection system PS will have a different Zernike expansion for each field point (i.e. for each spatial location in its image plane, for example the substrate plane 102).

The projection system PS comprises a plurality of optical elements (including mirrors 13, 14). As already explained, although the projection system PS is illustrated as having only two mirrors 13, 14 in FIG. 1, the projection system PS may include a different number of mirrors (e.g. six or eight mirrors). The lithographic apparatus LA may further comprise adjusting means for adjusting these optical elements so as to correct for aberrations (any type of phase variation across the pupil plane throughout the field), once the aberrations have been determined (e.g. by determining an aberration map). To achieve this, the adjusting means PA may be operable to manipulate optical elements within the projection system PS in one or more different ways. The adjusting means PA may be operable to do any combination of the following: displace one or more optical elements; tilt one or more optical elements; and/or deform one or more optical elements. Deformation of an optical element may be performed for example by using actuators to exert force on sides of the optical element and/or by using heating elements to heat selected regions of the optical element.

The aberration map of the projection system PS in its pupil plane may be determined by projecting radiation from an object in the reticle plane 100 of the projection system PS, through the projection system PS and using a shearing interferometer to measure a wavefront (i.e. a locus of points with the same phase). A first diffraction grating (for example a one-dimensional reflective grating) is disposed in the illumination region of the reticle plane 100 and is illuminated by radiation beam B. This causes diffraction of the radiation beam B, with a plurality of diffraction orders separated in a shearing direction, which are at least partially captured by the projection system PS. A second diffraction grating (for example, a transmissive two-dimensional checkerboard or pinhole array grating) is disposed in the illumination region of the substrate plane 102. The projection system forms an image of the first diffraction grating (in the reticle plane 100) on the second diffraction grating (in the substrate plane 102).

The detector D is positioned to receive radiation from the substrate plane 102 (that is, the detector D receives radiation from the diffraction grating positioned in the substrate plane 102). The detector D outputs a signal which is indicative of the wavefront. From the signal, the aberration map may be derived using any known method (e.g. using Zernike coefficients as discussed above). The aberration map may be derived using computational methods on a processor, for example on a computer associated with the lithographic apparatus.

The pitches of the first and second diffraction gratings are matched (taking into account any reduction factor applied by the projection system PS). That is, taking any reduction factor into account, the pitch of the first and second diffraction gratings in the shearing direction may be equal. This matching of the pitches causes spatial overlap of coherent rays from the radiation beam B, which results in an interference pattern in a plane of the detector D.

The first and second diffraction gratings are scanned or stepped relative to each other in the shearing direction, causing an oscillation of the interference signal. The first diffraction grating and/or the second diffraction grating may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal (which may be referred to as a phase stepping signal) may contain information about the derivative of a wavefront in the stepping direction. Measurements may be made using two mutually orthogonal shearing directions, which allows information about the wavefront to be derived in two perpendicular directions (in particular, it provides information about a derivative of the wavefront in each of the two perpendicular directions), thereby allowing the full wavefront to be reconstructed.

The pupil shape (i.e. the angular distribution of the radiation beam B in a pupil plane) may be determined as follows. A pinhole is positioned in the illumination region of the reticle plane 100. A pinhole is positioned in the corresponding illumination region of the substrate plane 102 such that the projection system PS produces an image of the pinhole in the reticle plane 100 at the pinhole in the substrate plane 102. Both pinholes are illuminated by illuminating the illumination region of the reticle plane 100 using the radiation beam B of the illumination system IL. The detector D positioned to receive radiation from the substrate plane 102 (that is, the detector D receives radiation from the pinhole positioned in the substrate plane 102). The detector D outputs a signal which is indicative of the angular distribution of the radiation beam B in the pupil plane. From the signal, the pupil shape may be determined using any known method. The pupil shape may be derived using computational methods on a processor, for example on a computer associated with the lithographic apparatus.

Figure 2:
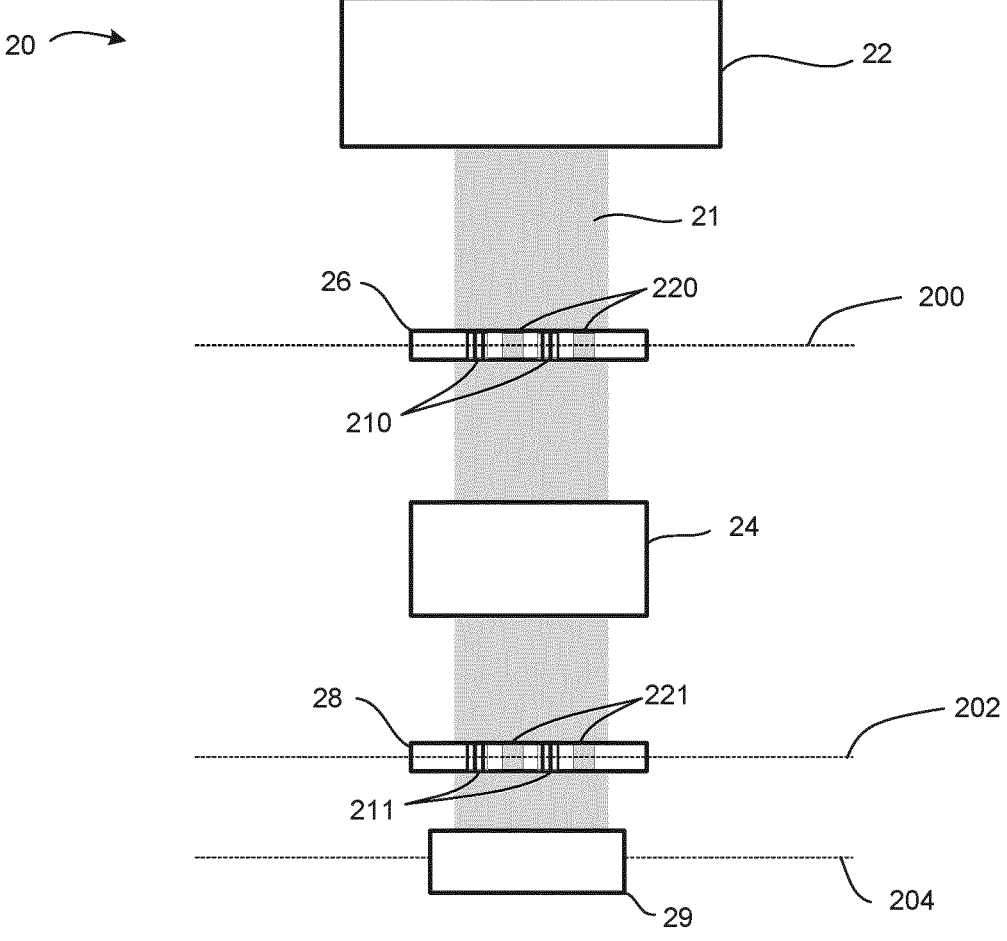
FIG. 2 depicts an imaging system.

FIG. 2 depicts an imaging system 20. The imaging system 20 may be representative of a portion of the lithographic apparatus LA of FIG. 1. The imaging system 20 comprises an illumination system 22, which may be of the same type of illumination system IL depicted in FIG. 1. The illumination system 22 is operable to generate an illumination beam 21 and illuminate a portion of a first plane 200 of the imaging system 20. The portion of the first plane 200 that is illuminated can be referred to as an illumination region. The first plane 200 may be, for example, the reticle plane 100 of FIG. 1. The imaging system 20 further comprises a projection system 24 which is operable to form an image of an object disposed in the first plane 200 in a second plane 202. The area in which an image is formed may be referred to as an illumination region, given that this region receives radiation from the illumination beam 21. The second plane 202 may be, for example, the substrate plane 102 of FIG. 1. The imaging system 20 further comprises a detector 29 which can receive radiation from the second plane. The detector 29 is arranged in a third plane 204, which may be conjugate to a pupil plane of the projection system 24. That is, the detector 29 can detect a pattern (e.g. an angular distribution or an interference pattern indicative of an aberration map) in the illumination beam 21 at a pupil plane of the projection system 24 (or a plane related thereto).

The imaging system further comprises a first and second plate 26, 28. The first plate 26 is positionable in the first plane 200, for example on a support structure (not shown). A support structure such as the support structure MT shown in FIG. 1 may be used. The first plate 26 has a plurality of markers 210, 220 which are arranged in a region of the first plate 26. The first plate 26 can be positioned in the first plane 200 such that all of the plurality of markers 210, 220 are illuminated by the illumination beam 21. That is, the plurality of markers 210, 220 are arranged in a manner that enables the plurality of markers 210, 220 to be positioned in the illumination region of the first plane 200. Similarly, the second plate 28 comprises a plurality of markers 211, 221 which are arranged in a region of the plate 28. The second plate 28 can be positioned in the second plane 202 such that all of the plurality of markers 211, 221 are illuminated by the illumination beam 21. That is, the plurality of markers 211, 221 are arranged in a manner that enables the plurality of markers 211, 221 to be positioned in the illumination region of the second plane 200.

The first plate 26 has a first subset of markers 210, each of which comprises a first type of marker. This first type of marker is configured for use in determining a first optical property of the illumination beam. For example, the first type of marker may be a diffraction grating and may be used to determine an aberration map. The first plate 26 has a second subset of markers 220, each of which comprises a second type of marker. The second type of marker is configured for use in determining a second optical property of the illumination beam. For example, the second type of marker may be a pinhole and may be used to determine the pupil shape of the illumination beam. Similarly, the second plate 28 has a first subset of markers 211, each of which comprises the same first type of marker, and a second subset of markers 221, each of which comprises the same second type of marker. The plurality of markers 210, 220 on the first plate 26 may be referred to as a first plurality of markers 210, 220. The plurality of markers 211, 221 on the second plate 28 may be referred to as a second plurality of markers 211, 221.

The arrangement of the second plurality of markers 211, 221 on the second plate 28 generally matches the arrangement of the first markers 210, 220 on the first plate 26. As such, when the plates are in position and illuminated, each marker on the first plate 26 (for example, a marker of the first type) is imaged onto a corresponding marker on the second plate 28 (for example, a corresponding marker of the first type). Such an arrangement may be referred to as a conjugate arrangement, as an image of each of the markers is formed on a corresponding marker of the same type in a conjugate plane.

When the plates are positioned as described above, the detector 29 receives radiation which has interacted with pairs of markers of the same type. For example, a portion of the illumination beam 21 interacts with a marker of the first type in the first plate 26 and a marker of the first type in the second plate 28 before being received by the detector 29. A different portion of the illumination beam 21 interacts with a marker of the second type in the first plate 26 and a marker of the second type in the second plate 28 before being received by the detector 29. As such, the detector 29 receives radiation which contains information relating to the first and second optical properties. The detector 29 can output this signal indicative of the first and/or second optical properties which can be passed, for example to a processor of a computer, to determine these optical properties.

Using an imaging system such as that shown in FIG. 2 with plates 26, 28 enables two different optical properties to be determined substantially simultaneously. This is because the illumination beam 21 of the illumination system 22 can illuminate the first plurality of markers 210, 220 in the first plane 200 and the second plurality of markers 211, 221 in the second plane 202 substantially simultaneously, and without needing to move either plate 26, 28 or the illumination beam 21. This is in contrast to previous systems where separate plates may have been used to determine a first optical property and a second optical property, or where significant movement of the plates or the illumination beam was required in order to switch between a first type of measurements to detect a first optical property and a second type of measurement to determine a second type of optical property. Using an arrangement as described herein, both optical properties can be determined in a single measurement. This results in a significant time saving, which maybe particularly beneficial when used in combination with a lithographic apparatus in which the throughput is of particular importance and any time saving is particularly beneficial.

It is noted that the illumination beam 21 in FIG. 2 is schematic in nature and may have a different shape and/or path in a real imaging system. For example, the illumination beam 21 may diverge and/or focus one or multiple times along the path between the illumination system 22 and the detector 29. Furthermore, the illumination beam 21 is shown to travel through each plate 26, 28, indicating transmissive markers 210, 220, 211, 221 (i.e. markers which permit propagation of at least a portion of the illumination beam 21). However, in other arrangements and implementations, reflective markers may be used (i.e. markers which reflect at least a portion of the illumination beam 21).

Figure 3:
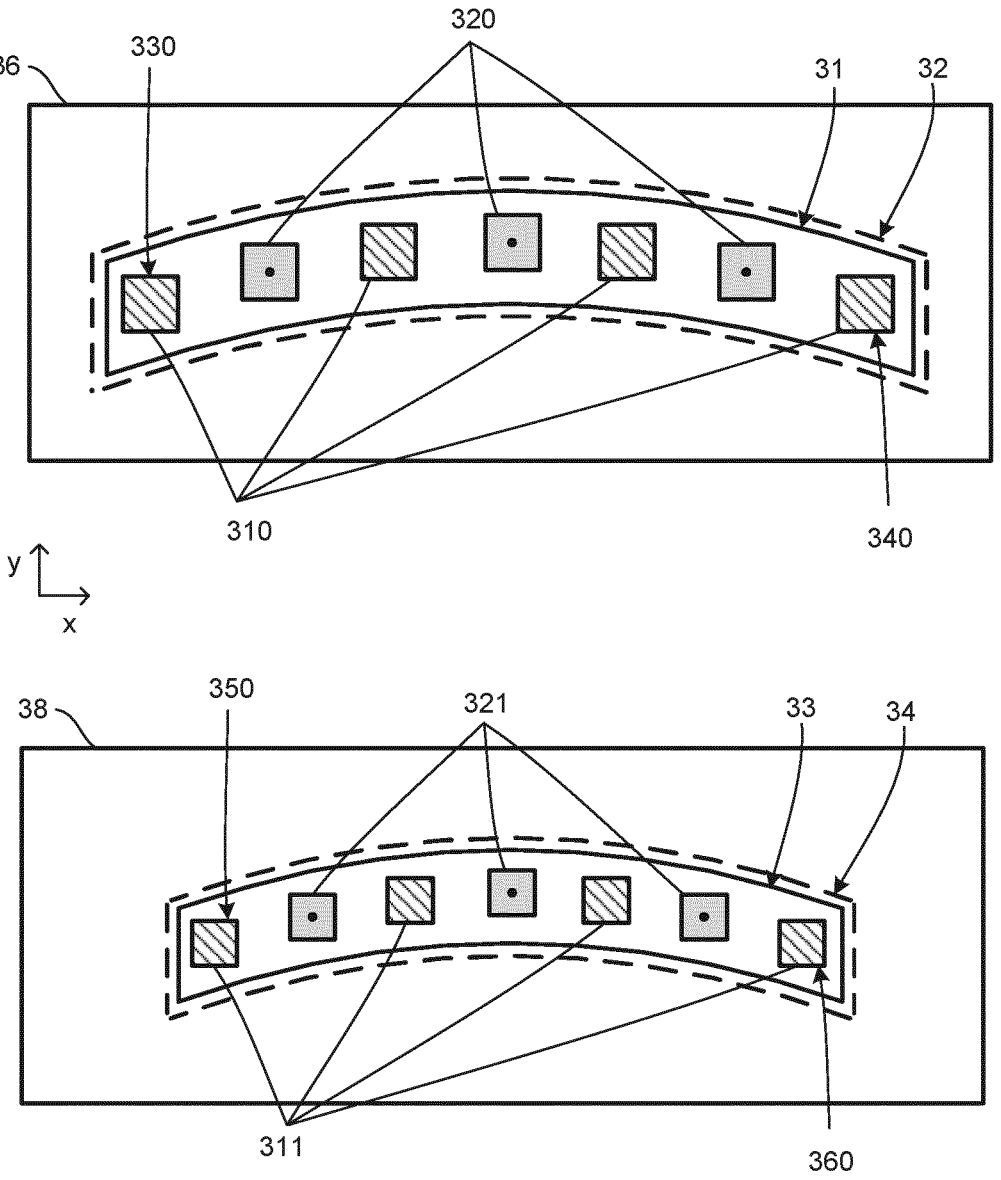
FIG. 3 depicts an example arrangement of markers on two plates.

FIG. 3 depicts an example arrangement of markers on two plates 36, 38. The first plate 36 may be used in place of the first plate 26 of FIG. 2, i.e. the first plate 36 is positionable in a first plane of an imaging system. The second plate 38 may be used in place of the second plate 28 of FIG. 2, i.e. the second plate 38 is positionable in a second plane of an imaging system.

The first plate 36 comprises a first plurality of markers 310, 320. A first subset 310 of the first plurality of markers comprise a first type of marker and a second subset 320 of the first plurality of markers comprise a second type of marker, similar to the markers as described with reference to FIG. 2. The first plurality of markers 310, 320 are arranged within a marker region 31. The marker region 31 is simply a region of the plate 36 in which all of the first plurality of markers 310, 320 are contained. The marker region 31 is depicted in FIG. 3 as a solid line which bounds the marker region 31. However, the marker region 31 is indicative in nature and need not take any physical form.

Also depicted, as a dashed line, in FIG. 3 is an illumination region 32. The illumination region 32 indicates a region of the first plate 36 which may be illuminated by the illumination beam of the illumination system (e.g. the beam 21 generated by the illumination system 22 of the imaging system of FIG. 2). In particular, the illumination region 32 indicates a region of the first plate 36 which may be illuminated when the first plate 36 is positioned in the illumination region of the first plane of the imaging system. It should be understood that, because the first plate 36 may be moved within the first plane, for example in a nominal x-direction and y-direction as indicated in FIG. 3, the illumination region 32 may correspondingly move in the x-direction and y-direction with respect to the first plate 36 and the plurality of markers 310, 320 thereon. However, the size and shape of the illumination region 32 will remain constant as the first plate 36 is moved within the first plane. The marker region 31 generally corresponds to the illumination region 32. They may have a similar size and shape. In the example depicted in FIG. 3, the marker region 31 has the same shape but a smaller size compared to the illumination region 32, i.e. the marker region 31 is a (smaller) scaled version of the illumination region 32. In other arrangements, the marker region 31 and illumination region 32 may be the same shape and size. In an alternative arrangement, the marker region 31 may be a different shape to the illumination region 32, but is shaped and sized such that the marker region 31 is entirely contained within the illumination region 32. Due to correspondence between the marker region 31 and the illumination region 32, it is possible to position the plurality of markers 310, 320 such that the entire marker region (and hence all of the markers 310, 320) is illuminated by the illumination beam. As two different types of markers (the first subset 310 and the second subset 320) are illuminated simultaneously, two different optical properties of the illumination beam may be determined substantially simultaneously.

It can be seen that the marker region 31 and illumination region 32 of the first plate 36 are elongate. That is, the marker region 31 has a size in a first direction (the x-direction) which is longer than its size in a second direction (the y-direction). The size in the first direction may be referred to as the longer direction and the size in the second direction may be referred to as the shorter direction. Additionally, the marker region 31 is curved along the longer direction. In some lithographic apparatuses, for example a lithographic apparatus LA such as that shown in FIG. 1, have a generally elongate and curved illumination region, therefore the marker arrangement depicted in FIG. 3 may be particularly beneficial for use in such a lithographic apparatus. The shorter dimension of the elongate region may coincide with a scanning direction of the lithographic apparatus or imaging system and the longer dimension of the elongate region may coincide with a non-scanning direction of the lithographic apparatus or imaging system. It should be understood, however, that any size and shape of marker region may be used depending on the specific imaging system the plate is to be used with.

The first plurality of markers 310, 320 may be arranged in any manner within the marker region 31. In the depicted example, the first plurality of markers 310, 320 are distributed across substantially all of the marker region 31. That is, a first marker 330 of the first plurality of markers 310, 320 is located at the first end of the marker region 31 and a second marker 340 of the first plurality of markers 310, 320 is located at a second end of the marker region 31 which is distal to the first end. It can be said that the first and second markers 330, 340 are located at opposite ends of the elongated region which comprises the marker region 31. The other markers of the first plurality of markers 310, 320 are distributed between the first and second markers 330, 340. By arranging the markers in this way, the markers are distributed across substantially all of the marker region 31 and, as such, a set of field points may be sampled that are distributed across substantially all of the illumination region 32. This enables the optical properties to be determined across substantially the whole illumination region 31. In the depicted examples, the plurality of markers 310, 320 are generally evenly distributed between the first and second marker 330, 340. However it should be understood that different arrangements are also possible.

The first plurality of markers 310, 320 depicted in FIG. 3 also alternate between the first type of marker and the second type of marker. By alternating between different types of markers within the marker region 31, each type of marker may be distributed across substantially all of the marker regions which enables each optical property to be determined over substantially all of the illumination region 31. It can be seen in the arrangement of FIG. 3 that the first optical property (determined using the first type of markers i.e. the first subset 310 of markers) can be determined across substantially the entire illumination region 32 but that the second optical property (determined using the second type of markers i.e. the second subset 320 of markers) is determined over a shorter extent in the x-direction. However, by alternating between markers, a significant portion of the illumination region 32 is still sampled with respect to the second optical property. This may be beneficial compared to having a cluster of the first type of marker in a first region of the marker region 31 and the second type of marker clustered in a second region of the marker region 31.

The second plate 38 comprises a second plurality of markers 311, 321. A first subset 311 of the second plurality of markers comprise a first type of marker and a second subset 321 of the second plurality of markers comprise a second type of marker, the second plurality of markers 311, 321 are arranged within a marker region 33 which generally corresponds to an illumination region 34.

The arrangement of the second plurality of markers 311, 321 generally matches the arrangement of the first plurality of markers 310, 320 of the first plate 36. In particular, a spatial ordering of the first 310 and second 320 types of marker 310, 320 within the first plurality of markers 310, 320 (in a longer dimension of the marker region 31) is the same as a spatial ordering of the first 311 and second 321 types of marker 311, 321 within the second plurality of markers 311, 321 (in a longer dimension of the marker region 34).

The illumination region 34 indicates a region of the second plate 38 which may be illuminated by the illumination beam of the illumination system (e.g. the beam 21 generated by the illumination system 22 of the imaging system of FIG. 2). In particular, the illumination region 32 indicates a region of the second plate 38 which may be illuminated when the second plate 36 is positioned in the illumination region of the second plane of the imaging system. As described above for the illumination region 32 of the first plate 36, because the second plate 38 may be moved within the second plane, the illumination region 34 may correspondingly move with respect to the second plate 38 and the plurality of markers 311, 321 thereon. However, the size and shape of the illumination region 33 will remain constant as the second plate 38 is moved within the first plane. The illumination region 34 and the marker region 33 of the second plate 38 are the same shape but smaller in size compared to the illumination region 32 and the marker region 31 of the first plate 31. This is because the plates 36, 38 depicted in FIG. 3 are for use with a projection system which applies a reduction factor.

The first and second type of markers of the second plate 38 are arranged within the marker region 33 in a manner that matches the arrangement of the first and second type of markers within the marker region 31 of the first plate 36. For example, a first marker 350 is located at the first end of the marker region 33, a second marker 360 is located at a second end of the marker region 33 which is distal to the first end, and the other markers are distributed between the first and second markers 350, 360 in an alternating fashion between the first and second type of marker. Because the marker region 33 of the second plate 38 is a scaled version of the marker region 31 of the first plate 36, the arrangement of the second plurality of markers 311, 321 is scaled accordingly with respect to the arrangement of the first plurality of markers 310, 320. Because the arrangement of markers on the first and second plate 36, 38 are matched, when the first and second plates 36, 38 are positioned in the first and second planes of the imaging system and illuminated an image of each of the first type of markers of the first plate 36 is formed on a corresponding first type of marker of the second plate 38.

In the above discussion, the first subset 310 of the first plurality of markers on the first plate 36 and the first subset 311 of the second plurality of markers on the second plate 38 are both described as comprising a first type of marker. Similarly, in FIG. 3, the first subset 310 of the first plurality of markers on the first plate 36 and the first subset 311 of the second plurality of markers on the second plate 38 are both shown rather schematically using a similar symbol. However, it will be appreciated by the skilled person that, in general, the first subset 310 of the first plurality of markers on the first plate 36 and the first subset 311 of the second plurality of markers on the second plate 38 are not identical. For example, the first subset 310 of the first plurality of markers on the first plate 36 may be of the form of a one-dimensional reflective grating; and the first subset 311 of the second plurality of markers on the second plate 38 may be of the form of a transmissive two-dimensional checkerboard or pinhole array grating.

Figure 4:
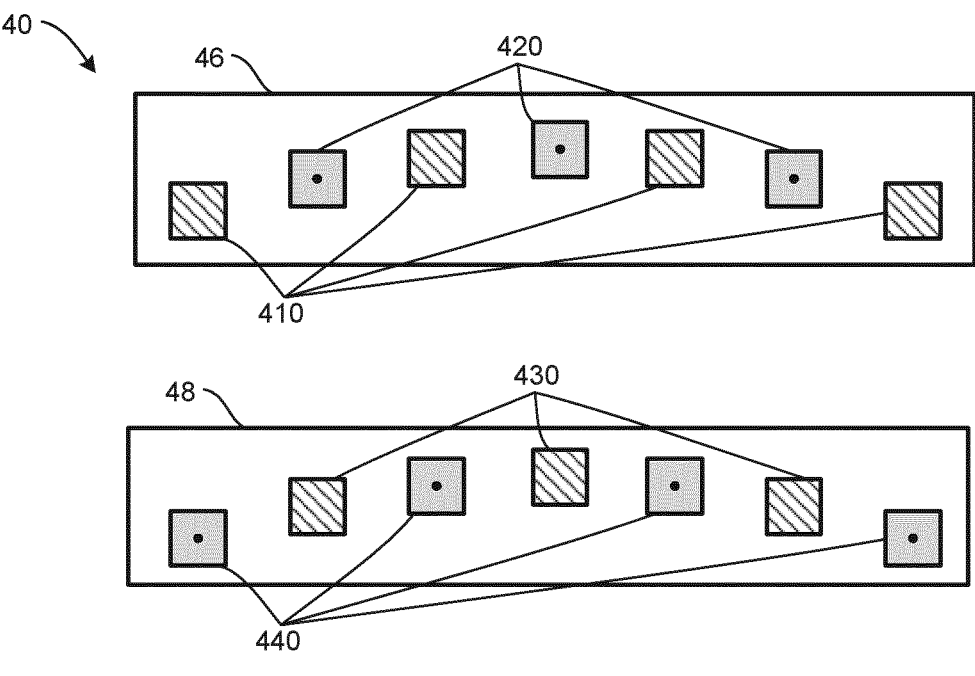
FIG. 4 depicts a plate system which may be used in an imaging system to determine two optical properties of an illumination beam of the imaging system.

FIG. 4 depicts a plate system 40 which may be used in an imaging system, for example the imaging system 20 of FIG. 2, to determine two optical properties of an illumination beam of the imaging system. The plate system 40 comprises a first plate 46 and second plate 48.

The first plate 46 has a first plurality of markers 410, 420. A first subset 410 of the first plurality of markers 410, 420 are a first type of marker configured for determining a first optical property of the illumination beam. A second subset 420 of the first plurality of markers 410, 420 are a second type of marker configured for determining a second optical property of the illumination beam. The first subset 410 of markers are located at a set of first locations and the second subset 420 of markers are located at a set of second locations. Similar to the arrangement depicted in FIG. 3, the markers 410, 420 alternate between the first type of marker and the second type of marker along the longer dimension of an elongate marker region in which the markers 410, 420 are located.

The second plate 48 of the plate system 40 has a second plurality of markers 430, 440. A first subset 430 of the second plurality of markers 430, 440 comprise the same first type of marker as the first subset 410 of markers on the first plate 46. A second subset 440 of the plurality of markers 430, 440 comprise the same second type of markers as the second subset 420 of markers on the first plate 46. The second plurality of markers 430, 440 on the second plate 48 are located at a set of locations which substantially correspond to the set of first and second locations of the first plate 46. That is, each of the set of locations on the second plate 48 at which one of the second plurality of markers 430, 440 is disposed corresponds to a location of one of the first plurality of markers 410, 420 on the first plate 46. However, the first subset 430 of markers on the second plate 48 are located at a set of second locations which correspond to the set of second locations of the first plate 46. Correspondingly, the second subset 440 of markers on the second plate 48 are located at a set of first locations which correspond to the set of first locations of the first plate 46. That is, for every position where a marker of the first type is found on the first plate 46, the corresponding location on the second plate 48 contains a marker of the second type and, for every position where a marker of the second type is found on the first plate 46, the corresponding location on the second plate 48 contains a marker of the first type. The arrangement of first and second types of markers on the two plates 46, 48 may be referred to as a complementary arrangement or as being arranged in reciprocal fashion.

In use, the plate system 40 is configured to be used at a single level of an imaging system. For example the plate system 40 may be used at the reticle level (i.e. each plate may be interchangeably positioned in the reticle plane or object plane) of an imaging system. Although described as being used at a single level of an imaging system (for example at reticle level), as discussed below, it will be appreciated that the plate 40 system may, in general, be used in conjunction with another substantially matched plate system provided at another level of the imaging system (for example at substrate level) in order to determine one or more optical properties of an illumination beam. Each plate 46, 48 may be used to take a single set of measurements and perform a determination of a first and second optical property of the illumination beam. Therefore, using each plate 46, 48 interchangeably enables two sets of measurements to be taken, each set of measurements using a different arrangement of markers on the plate, and each set of measurements allowing multiple determinations of the first and second optical properties to be performed.

For a first measurement process (or first set of measurements), the first plate 46 can be inserted into the reticle plane such that the first plurality of markers 410, 420 are illuminated by the illumination beam. In this arrangement, a first set of field points corresponding to the set of first locations (i.e. where the first subset 410 of markers are located) are sampled to determine the first optical property and a second set of field points corresponding to the set of second locations (i.e. where the second subset 420 of markers are located) are sampled to determine the second optical property. For a second measurement process (or first set of measurements), the second plate 48 can instead be inserted into the reticle plane such that the second plurality of markers 430, 440 are illuminated by the illumination beam. In this arrangement, a first set of field points corresponding to the set first locations (i.e. where the second subset 440 of markers are located) are sampled to determine the second optical property and a second set of field points corresponding to the set of second locations (i.e. where the first subset 430 of markers are located) are sampled to determine the first optical property. In this way, by using both plates 46, 48 to perform both sets of measurements, each optical property can be sampled at every field location which corresponds to the location of the markers (i.e. comprising the set of first and second locations) in two measurements.

A single set of measurements, which uses only the first plate 46 or only the second plate 48, may yield a lower accuracy determination of the first and second optical property because only a subset of the field points are sampled in order to determine each optical property. By taking two sets of measurements, using the first and second plates 46, 48 sequentially, a more accurate determination of the first and second optical property may be gained as each field because each optical property is sampled at every field point over two sets of measurements. It has be found that acceptable imaging performance can be achieved by sampling each field point every two sets of measurements. Such a plate system 40 enables information about the first and second optical properties to be gained with increased frequency (i.e. every in every set of measurements), as well as enabling higher accuracy determinations to be made with a relatively high frequency (every other set of measurements).

The plate system 40 yields an additional benefit in that, if one of the plates 46, 48 was to become damaged or contaminated, the other plate 46, 48 can continue to be used to determine the first and second optical property without requiring any components to be removed, cleaned or replaced. This may lead to increased uptime of an imaging system, and correspondingly to a higher throughput for a lithographic apparatus comprising said imaging system.

The plate system 40 depicted in FIG. 4 features two separate plates 46, 48. However, in an alternative implementation a single plate may be used which comprises both the first and second pluralities of markers 410, 420, 430, 440. That is, the plates 46, 48 may be unitary. In this implementation, the single plate can be positioned in the plane and positioned such that either the first plurality of markers 410, 420 or the second plurality of markers 430, 440 are illuminated by illumination beam.

Additionally or alternatively, one or both of the plates 46, 48 may form part of a patterning device for example a patterning device in MA of FIG. 1. In this implementation, the patterning device may have a central region which comprises a pattern to be imaged by a lithographic apparatus and the pluralities of markers 410, 420, 430, 440 may be arranged at an edge region of the patterning device.

The plate system 40 has been above described as being positionable in a first (e.g. reticle) plane of an imaging system. However, it will be appreciated that the plate system 40 may also be used in a second (e.g. wafer) plane of an imaging system. When such a plate system 40 is used at a wafer level of an imaging system, one or more of the plates 46, 48 may form part of a substrate table, for example the substrate table WT of FIG. 1. Alternatively, one or more of the plates 46, 48 may form part of a detector (e.g. the detector D of FIG. 1 or the detector 29 of FIG. 2) and may be, for example, affixed to the detector. In this implementation, one or more of the plates 46, 48 may be positioned such that, when illuminated by the illumination beam, radiation from those plates 46, 48 (e.g. that has interacted with the markers) is received by a radiation receiving portion of the detector.

Another plate system may comprise the plate system 40 of FIG. 4 for use in the first plane of the imaging system and additionally comprise a third and fourth plate for use in the second plane of the imaging system. In this alternative plate system, the third and fourth plate are generally matched to the first and second plate 46, 48 (that is, for example, the arrangement of markers on the third plate generally matches the arrangement of markers on the first plate 46 and the markers on the fourth plate are arranged in a reciprocal fashion with respect the third plate such that the arrangement of markers on the fourth plate generally matches the arrangement of markers on the second plate 48). For example, a spatial ordering of the first plurality of markers 410 and the second plurality of markers 420 on the first plate 46 (in a longer dimension of the first plate 46) may be the same as a spatial ordering of the first plurality of markers and the second plurality of markers on the third plate (in a longer dimension of the third plate). Similarly, a spatial ordering of the first plurality of markers 430 and the second plurality of markers 440 on the second plate 48 (in a longer dimension of the second plate 48) may be the same as a spatial ordering of the first plurality of markers and the second plurality of markers on the fourth plate (in a longer dimension of the fourth plate).

The third and fourth plate are generally matched to the first and second plate 46, 48 in an analogous way to the way that the second plurality of markers 311, 321 of the second plate 38 generally matches the arrangement of the first plurality of markers 310, 320 of the first plate 36 in FIG. 3. In use, the plate system 40 of FIG. 4 can be arranged in the first plane, alternating between the first plate 46 and the second plate 48 for each measurement, while the additional plate system can be arranged in the second plane, alternating between the third plate and the fourth plate correspondingly. In this other plate system, the first and second plate may in fact be unitary and the third and fourth plate may additionally or alternatively be unitary.

Figure 5:
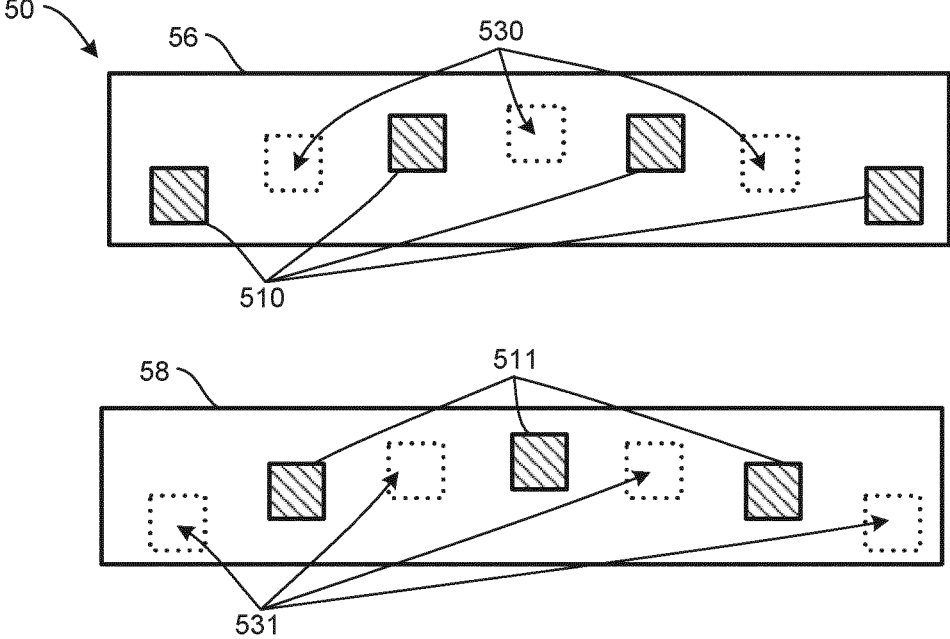
FIG. 5 depicts a plate system which may be used in an imaging system to determine an optical property of an illumination beam of the imaging system.

FIG. 5 depicts a plate system 50 which may be used in an imaging system, for example the imaging system 20 of FIG. 2, to determine an optical property of an illumination beam of the imaging system. The plate system comprises a first plate 56 and a second plate 58.

The first plate 56 has a first plurality of markers 510 which are of a first type of marker, configured for determining a first optical property of the illumination beam. FIG. 5 schematically depicts the first plurality of markers 510 as gratings configured for determining an aberration map. However, any other type of marker may be selected so as to determine an optical property. The first plurality of markers 510 are located at a set of first locations on the first plate 56.

The first plate 56 has, at a set of second locations, regions which comprise no markers 530. That is, at a defined set of second locations, the plate comprises no markers and is substantially blank. The bodies, or lack thereof, located at each second location may be referred to as a blank 530.

The first plurality of markers 510 and blanks 530 of the first plate 56 are arranged in a marker region (not indicated) which generally corresponds to the illumination region of the imaging system. In particular, in the depicted arrangement, the set of first locations and set of second locations are equally spaced along an elongate, curved marker region and alternate between the first type of marker and blanks. It should be understood that in other implementations (e.g. with a different imaging system and/or different illumination region), different arrangement of markers and marker regions are possible.

The second plate 58 has markers 511 and blanks 531 arranged in a reciprocal fashion with respect to the first plate 56. That is, the second plate 58 has, at a set of second locations, a second plurality of markers 511 wherein the set of second locations of the second plate 58 corresponds to the set of second locations of the first plate 56. In other words, in the defined set of locations of the first plate 56 where blanks 530 are positioned, the second plate 58 comprises markers 511. Furthermore, the second plate 58 has, at a set of first locations, regions which comprise no markers 531, wherein the set of first locations of the second plate 58 corresponds to the set of first locations of the first plate 56. In other words, in the defined set of locations of the first plate 56 where markers 510 are positioned, the second plate 58 comprises no markers. The regions which comprise no markers may be referred to as blanks 531. The second plurality of markers 511 are the same type of marker as the first plurality of markers 510 of the first plate 56. The blanks 531 on the second plate 58 are comparable to the blanks 530 of the first plate 56. Because the first and second locations of the first and second plates 56, 58 are equivalent, it follows that the arrangement of markers 511 and blanks 531 on the second plate 58 is arranged in a marker region which generally corresponds to the illumination region of the imaging system.

In use, the plate system 50 is configured to be used at a single level of an imaging system. For example the plate system 50 may be used at the reticle level (i.e. each plate may be interchangeably positioned in the reticle plane) of an imaging system. Although described as being used at a single level of an imaging system (for example at reticle level), as discussed below, it will be appreciated that the plate 50 system may, in general, be used in conjunction with another substantially matched plate system provided at another level of the imaging system (for example at substrate level) in order to determine one or more optical properties of an illumination beam. Each plate 56, 58 may be used to take a single set of measurements and perform a determination of an optical property of the illumination beam. Therefore, using each plate 56, 58 interchangeably enables two sets of measurements to be taken, each set of measurements using a different arrangement of markers on the plate, and each set of measurements allowing multiple determinations of the optical property performed.

In a first measurement process (for example a first set of measurements), the first plate 56 can be inserted into the reticle plane such that the first plurality of markers 510 and blanks 530 are illuminated by illumination beam. In this arrangement, a first set of field points corresponding to the set of first locations (i.e. where the first plurality of markers 510 are located) are sampled to determine the optical property. In a second measurement process (for example a second set of measurements), the second plate 58 can be inserted into the reticle plane such that the second plurality of markers 511 and blanks 530 are illuminated by illumination beam. In this arrangement, a second set of field points corresponding to the set of second locations (i.e. where the second plurality of markers 511 are located) are sampled to determine the optical property. In this way, the optical property can be fully sampled at every field location which corresponds to the location of the markers (i.e. comprising the set of first and second locations) in two sets of measurements. As described previously with reference to the plate system 40 of FIG. 4, a single set of measurements using only one plate 56, 58 may yield a lower accuracy determination of the optical property because only a subset of the field points are sampled, and a more accurate determination may be generated after two sets of measurements have been made. Such a plate system 50 enables information about the optical property to be gained with increased frequency (i.e. every set of measurements), as well as enabling higher accuracy determinations to be made with a relatively high frequency (every other set of measurements).

Within an EUV lithographic apparatus, some parts of the apparatus may be subject to contamination, for example, in the presence of EUV radiation from the source of the illumination beam. Parts of the apparatus at substrate level may be particularly susceptible to such contamination. Markers at reticle level, for example gratings and pinholes, may permit onward travel of the illumination beam to wafer level. Contamination of markers at substrate level which may cause a reduction in the accuracy with which aberrations and pupil shape may be determined and/or may necessitate cleaning and/or replacement of elements. By providing n plates, each plate may be used 1/n th of the time and some of the locations on the plates can comprise no markers. This can reduce the amount of contamination which each wafer level marker is subject to.

By providing locations which comprise no markers in a plate system as described herein, wherein the locations have no marker on a first plate but have different types of markers on other plates, contamination can be reduced while still enabling the determination of optical properties at relevant field points (i.e. corresponding to the first, second and third locations). Each time a different plate of the three plates is used, a different set of locations (i.e. the set of first, second or third locations) is shielded from contamination while the other two sets of locations are sampled. This may provide a beneficial trade-off between collecting information for determining optical properties while also reducing contamination.

Therefore, advantageously, the blanks 530, 531 reduce the frequency with which substrate level markers are subject to contamination if the two plates 56, 58 are used alternately. The blanks 530, 531 may comprise a medium which does not allow for onward propagation of portions of the illumination beam. For example, in an implementation which uses transmissive markers on the plates (i.e. markers which allow propagation of portions of the illumination beam through the markers), the blanks 530, 531 may be substantially opaque to the illumination beam. Contamination in systems generally has negative consequences such as reduced performance, reduced lifetime, and it is often beneficial to clean or replace contaminated components. In particular, contamination of a detector configured to receive radiation from a plate as described herein (e.g. the detector D of FIG. 1 or the detector 29 of FIG. 2) may reduce its ability to output a signal indicative of the first and/or second optical property and/or lead to a reduced accuracy of determining optical properties.

By providing a plate system 50 with a reciprocal arrangement of markers 510, 511 and blanks 530, 531, on two plates 56, 58 that are used at half the frequency that a single plate arrangement may be used, each substrate level marker may receive radiation at half the frequency (relative to a single plate arrangement) while still enabling the determination of the optical property at all relevant field points. For example, while using the first plate 56, the second set of locations are essentially shielded from radiation and therefore less prone to contamination while the first set of locations are sampled to determine the optical property. Similarly, while using the second plate 58, the first set of locations are shielded from radiation and therefore less prone to contamination while the second set of locations are sampled to determine the optical property.

Evidently, there are other regions of the plates 56, 58 which may additionally be blank (e.g. the area surrounding the marker region, the area between the first locations and second locations). However, the reciprocal arrangement of markers 510, 511 and blanks 530, 531 on the two plates 56, 58 yields an important benefit of reducing contamination in the imaging system.

The plate system 50 depicted in FIG. 5 features two separate plates 56, 58. However, in an alternative implementation a single plate may be used which comprises both the first and second pluralities of markers 510, 511 and blanks 530, 531. That is, the plates 56, 58 may be unitary. In this implementation, the single plate can be positioned in the plane and positioned such that either the first plurality of markers 510 and blanks 530, or the second plurality of markers 511 and blanks 531, are illuminated by illumination beam.

Additionally or alternatively, one or both of the plates 56, 58 may form part of a patterning device, for example the patterning device MA of FIG. 1. In this implementation, the patterning device may have a central region which comprises a pattern to be imaged by a lithographic apparatus and the pluralities of markers 510, 511 and blanks 530, 531 may be arranged at an edge region of the patterning device.

The plate system 50 has been above described as being positionable in a first (e.g. reticle) plane of an imaging system. However, it will be appreciated that the plate system 50 may also be used in a second (e.g. wafer) plane of an imaging system. When such a plate system 50 is used at a wafer level of an imaging system, one or more of the plates 56, 58 may form part of a substrate table, for example the substrate table WT of FIG. 1. Alternatively, the plate system 50 may form part of a detector (e.g. the detector D of FIG. 1 or the detector 29 of FIG. 2) and may be, for example, affixed to the detector. In this implementation, one or more of the plate(s) 56, 58 may be positioned such that, when illuminated by the illumination beam, radiation from those plates 56, 58 (e.g. that has interacted with the markers) is received by a radiation receiving portion of the detector.

Another plate system may comprise the plate system 50 of FIG. 5 for use in the first plane of the imaging system and additionally comprise a third and fourth plate for use in the second plane of the imaging system. In this alternative plate system, the third and fourth plate are generally matched to the first and second plate 56, 58 (that is, for example, the arrangement of markers and blanks on the third plate generally matches the arrangement of markers 510 and blanks 530 on the first plate 56 and the markers on the fourth plate are arranged in a reciprocal fashion with respect the third plate such that the arrangement of markers and blanks on the fourth plate generally matches the arrangement of markers 511 and blanks 531 on the second plate 58). For example, a spatial ordering of the markers 510 and blanks 530 on the first plate 56 (in a longer dimension of the first plate 56) may be the same as a spatial ordering of the markers and blanks on the third plate (in a longer dimension of the third plate). Similarly, a spatial ordering of the markers 511 and blanks 531 on the second plate 58 (in a longer dimension of the second plate 58) may be the same as a spatial ordering of the markers and blanks on the fourth plate (in a longer dimension of the fourth plate). The third and fourth plate are generally matched to the first and second plate 56, 58 in an analogous way to the way that the second plurality of markers 311, 321 of the second plate 38 generally matches the arrangement of the first plurality of markers 310, 320 of the first plate 36 in FIG. 3. In use, the plate system 50 of FIG. 5 can be arranged in the first plane of the imaging system, alternating between the first plate 56 and the second plate 58 for each set of measurements, while the additional plate system can be arranged in the second plane, alternating between the third plate and the fourth plate correspondingly. In this other plate system, the first and second plate may in fact be unitary and the third and fourth plate may additionally or alternatively be unitary.

Figure 6:
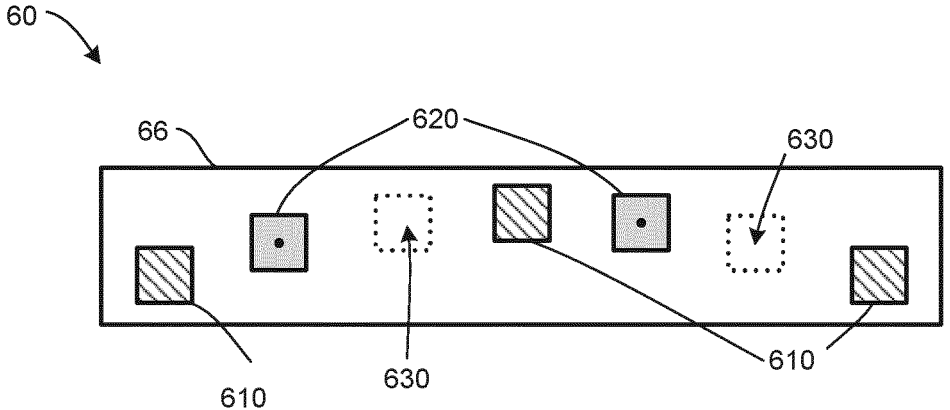
FIG. 6 depicts a plate system which may be used in an imaging system to determine two optical properties of an illumination beam of the imaging system.
Figure 6:
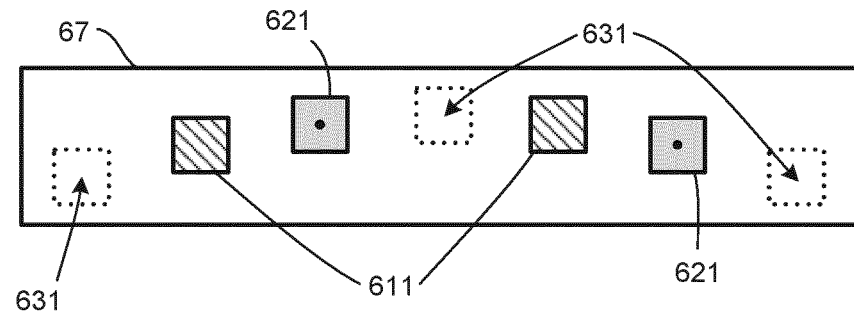
Figure 6:
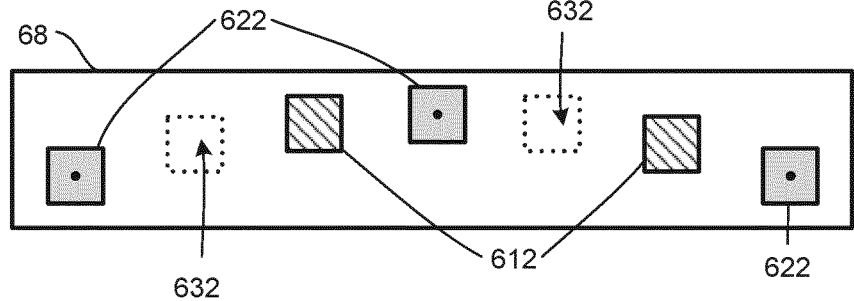

FIG. 6 depicts a plate system 60 which may be used in an imaging system, for example the imaging system 20 of FIG. 2, to determine two optical properties of an illumination beam of the imaging system. The plate system 60 comprises a first plate 66, a second plate 67 and a third plate 68. As with previously described plate systems, the plates 66, 67, 68 may in fact be unitary rather than three individual plates as illustrated in FIG. 6.

The first plate 66 has a first plurality of markers 610, 620. A first subset 610 of the first plurality of markers 610, 620 are a first type of marker configured for determining a first optical property of the illumination beam. A second subset 620 of the first plurality of markers 610, 620 are a second type of marker configured for determining a second optical property of the illumination beam. The first subset 610 of markers are located at a set of first locations and the second subset 620 of markers are located at a set of second locations. The first plate 66 also has a set of third locations which comprise regions with no markers 630 which may be referred to as blanks 630.

The second plate 67 has a second plurality of markers 611, 621. A first subset 611 of the second plurality of markers 611, 621 are the first type of marker and are located at a set of second locations which correspond to the set of second locations of the first plate 66. That is, markers of the first type on the second plate 67 occupy the locations occupied by the second type of markers on the first plate 66. A second subset 621 of the second plurality of markers 611, 621 are the second type of marker and are located at a set of third locations which correspond to the set of third locations of the first plate 66. That is, the markers of the second type on the second plate 67 occupy the locations occupied by blanks on the first plate 66. The second plate 67 also has a set of first locations which comprise regions with no markers 631 which may be referred to as blanks. The set of first locations of the second plate 67 corresponds to the set of first locations of the first plate 66. That is, the blanks 631 on the second plate 67 occupy the locations occupied by markers of the first type on the first plate 66.

The third plate 68 has a third plurality of markers 612, 622. A first subset 612 of the third plurality of markers 612,

622 are the first type of marker and are located at a set of third locations which correspond to the set of third locations of the first plate 66. That is, markers of the first type on the third plate 68 occupy the locations occupied by blanks on the first plate 66 (and by markers of the second type on the second plate 67). A second subset 622 of the third plurality of markers 612, 622 are the second type of marker and are located at a set of first locations which correspond to the set of first locations of the first plate 66. That is, the markers of the second type on the third plate 68 occupy the locations occupied by the first type of markers on the first plate 66. The third plate 68 also has a set of second locations which comprise regions with no markers 632 which may be referred to as blanks. The set of second locations of the third plate 68 corresponds to the set of second locations of the first plate 66. That is, the blanks 632 on the third plate 68 occupy the locations occupied by markers of the second type on the first plate 66.

In summary, the markers and blanks of the first, second and third plates 66, 67, 68 are arranged in a reciprocal fashion or a cyclic fashion.

On each plate 66, 67, 68, the markers and blanks are arranged in a marker region (not indicated) which generally corresponds to the illumination region of the imaging system. In particular, in the depicted arrangement, the set of first locations, set of second locations and set of third locations are equally spaced along an elongate, curved marker region and alternate between the first type of marker, second type of marker and blanks in a cyclic fashion. It should be understood that in other implementations (e.g. with a different imaging system and/or different illumination region), different arrangement of markers and marker regions are possible.

In use, the plate system 60 is configured to be used at a single level of an imaging system. For example the plate system 60 may be used at the reticle level (i.e. each plate may be interchangeably positioned in the reticle plane) of an imaging system. Although described as being used at a single level of an imaging system (for example at reticle level), as discussed below, it will be appreciated that the plate 60 system may, in general, be used in conjunction with another substantially matched plate system provided at another level of the imaging system (for example at substrate level) in order to determine one or more optical properties of an illumination beam. Each plate 66, 67, 68 may be used to take a single set of measurements and perform a determination of an optical property of the illumination beam. Therefore, using each plate 66, 67, 68 interchangeably enables three sets of measurements to be taken, each set of measurements using a different arrangement of markers on the plate, and each set of measurements allowing multiple determinations of the optical property to be performed.

In a first measurement process (for example a first set of measurements), the first plate 66 can be inserted into the reticle plane such that the first plurality of markers 610, 620 and blanks 630 are illuminated by illumination beam. In this arrangement, a first set of field points corresponding to the set of first locations (i.e. where the first subset of markers 610 are located) are sampled to determine the first optical property and a second set of field points corresponding to the set of second locations (i.e. where the second subset of markers 620 are located) are sampled to determine the second optical property. A third set of field points corresponding to the set of third locations (i.e. where the blanks 630 are located) are shielded (and, as discussed above, can reduce contamination).

In a second measurement process (for example a second set of measurements), the second plate 67 can be inserted into the reticle plane such that the second plurality of markers 611, 621 and blanks 631 are illuminated by illumination beam. In this arrangement, the second set of field points corresponding to the set of second locations (i.e. where the first subset 611 of the second plurality of markers 611, 621 are located) are sampled to determine the first optical property and the third set of field points (i.e. where the second subset 621 of the second plurality of markers 611, 621 are located) are sampled to determine the second optical property. The first set of field points corresponding to the set of first locations (i.e. where the blanks 631 are located) are shielded (and, as discussed above, can reduce contamination).

In a third measurement process (for example a third set of measurements), the third plate 68 can be inserted into the reticle plane such that the third plurality of markers 612, 622 and blanks 632 are illuminated by illumination beam. In this arrangement, the third set of field points corresponding to the set of third locations (i.e. where the first subset 612 of the third plurality of markers 612, 622 are located) are sampled to determine the first optical property and the first set of field points (i.e. where the second subset 622 of the third plurality of markers 612, 622 are located) are sampled to determine the second optical property. The second set of field points corresponding to the set of second locations (i.e. where the blanks 632 are located) are shielded (and, as discussed above, can reduce contamination).

In this way, the first and second optical properties can be fully sampled at every field location which corresponds to one of the locations of the markers (i.e. comprising the set of first, second and third locations) in three sets of measurements. It has be found that acceptable imaging performance can be achieved only sampling each field point every three sets of measurements. As described previously with reference to the plate system 40 of FIG. 4 and the plate system 5 of FIG. 5, a single set of measurements using only one plate 66, 67, 68 may yield a lower accuracy determination of the optical property because only a subset of the field points are sampled, and a more accurate determination may be generated after two or three sets of measurements. Such a plate system 60 enables information about the first and second optical properties to be gained with increased frequency (i.e. every set of measurements), as well as enabling higher accuracy determinations to be made with a relatively high frequency (every two or three sets of measurements). Furthermore, by providing three plates 66, 67, 68 with a reciprocal arrangement of markers 610, 620, 611, 621, 612, 622 and blanks 630, 631, 632, contamination can be reduced while still enabling the determination of the optical properties at relevant field points.

The plate system 60 may form part of a patterning device, for example the patterning device MA of FIG. 1, a reticle table (for example support structure MT of FIG. 1) or a substrate table, for example the substrate W or substrate table WT of FIG. 1. Alternatively, the plate system 60 may form part of a detector (e.g. the detector D of FIG. 1 or the detector 29 of FIG. 2) and may be, for example, affixed to the detector. In this implementation, one or more of the plates 66, 67, 68 may be positioned such that, when illuminated by the illumination beam, radiation from those plate 66, 67, 68 (e.g. that has interacted with the markers) is received by a radiation receiving portion of the detector.

The plate system 60 may be used at a reticle level or at a wafer level of an imaging system of lithographic system. A correspondingly matched plate system may be used at the other of the reticle level or wafer level of the imaging system. That is, another plate system may comprise the plate system 60 of FIG. 6 for use in the first plane of an imaging system and additionally comprise a fourth, fifth and sixth plate for use in the second plane of the imaging system, where the fourth, fifth and sixth plates are generally matched to the first, second and third plates 66, 67, 68. For example, a spatial ordering of the markers 610, 620, 611, 621, 612, 622 and blanks 630, 631, 632 on the first plate 66 (in a longer dimension of the first plate 66) may be the same as a spatial ordering of the markers and blanks on the fourth plate (in a longer dimension of the fourth plate). Similarly, a spatial ordering of the markers 610, 620, 611, 621, 612, 622 and blanks 630, 631, 632 on the second plate 67 (in a longer dimension of the second plate 68) may be the same as a spatial ordering of the markers and blanks on the fifth plate (in a longer dimension of the fifth plate). Similarly, a spatial ordering of the markers 610, 620, 611, 621, 612, 622 and blanks 630, 631, 632 on the third plate 68 (in a longer dimension of the third plate 68) may be the same as a spatial ordering of the markers and blanks on the sixth plate (in a longer dimension of the sixth plate). In this other plate system, the fourth, fifth and sixth plates may be unitary.

Figure 7:
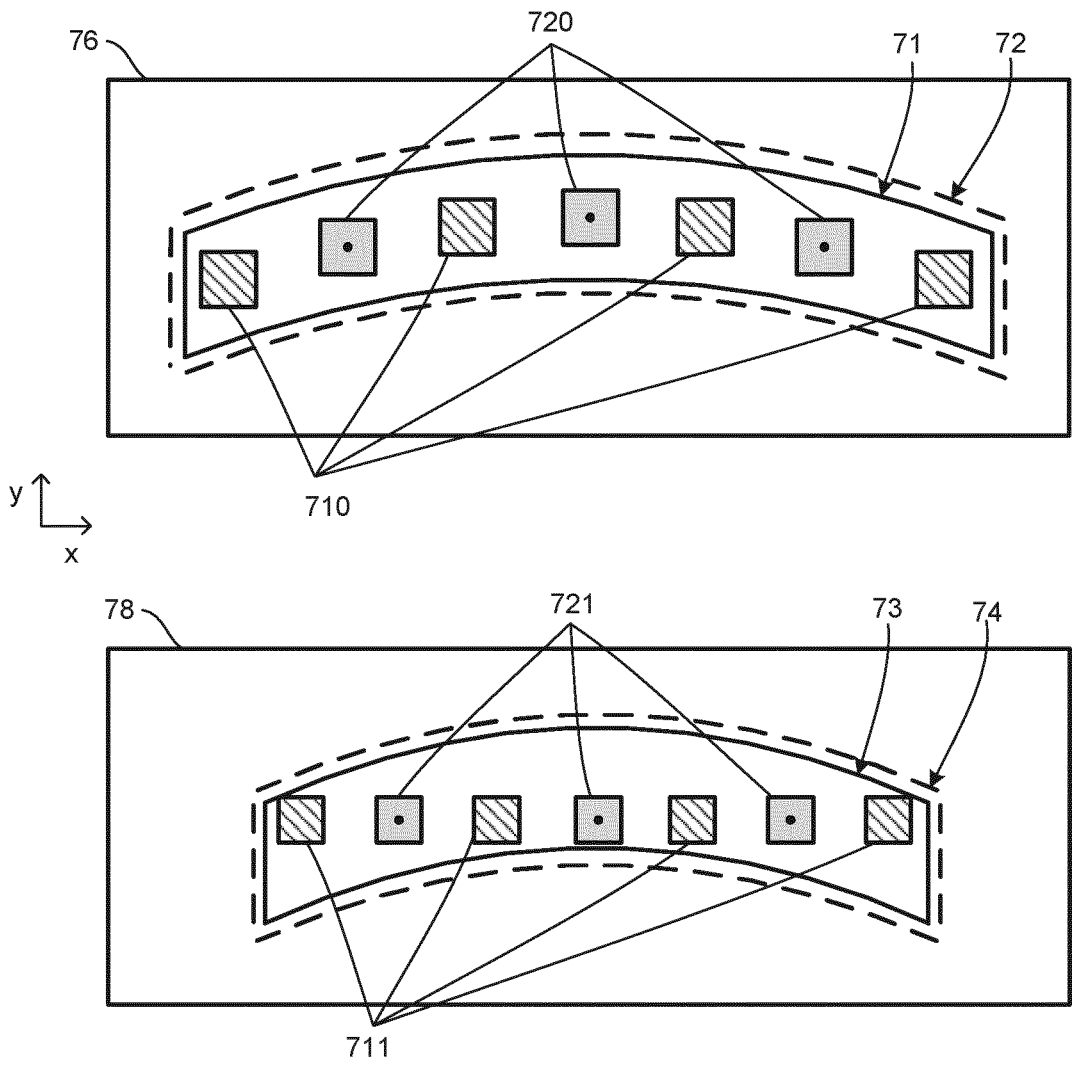
FIG. 7 depicts an example arrangement of markers on two plates.

FIG. 7 depicts an example arrangement of markers on two plates 76, 78. One of the first plate 76 and the second plate 78 may be used in place of the first plate 26 of FIG. 2, i.e. one of the two plates 76, 78 may be positionable in a first plane of an imaging system. The other one of the first plate 76 and the second plate 78 may be used in place of the second plate 28 of FIG. 2, i.e. the other one of the two plates 76, 78 may be positionable in a second plane of an imaging system.

In one embodiment, the first plate 76 may be used in place of the first plate 26 of FIG. 2, i.e. the first plate 76 is positionable in a first plane of an imaging system and the second plate 78 may be used in place of the second plate 28 of FIG. 2, i.e. the second plate 78 is positionable in a second plane of an imaging system. A nominal x-direction and y-direction are depicted. The x-direction may correspond to a non-scanning direction of an imaging system in which the plates 76, 78 are used. The y-direction may correspond to a scanning direction of an imaging system in which the plates 76, 78 are used.

The first plate 76 is comparable to the first plate 36 depicted in FIG. 3. That is, the first plate 76 comprises a first plurality of markers 710, 720 arranged in a marker region 71 which generally corresponds to an illumination region 72. A first subset 710 of the first plurality of markers comprise a first type of marker and a second subset 720 of the first plurality of markers comprise a second type of marker. The marker region 71 and illumination region 72 are elongate and curved, and the markers 710, 720 are arranged in an elongate, curved manner, with a radius of curvature which generally corresponds to the curvature of the elongate illumination region 72.

The second plate 78 is similar to the second plate 38 depicted in FIG. 3, but has a different arrangement of markers. The second plate 78 comprises a second plurality of markers 711, 721 arranged in a marker region 73 which generally corresponds to an illumination region 74. A first subset 711 of the second plurality of markers comprise a first type of marker and a second subset 721 of the second plurality of markers comprise a second type of marker. The markers 711, 721 are arranged, however, in a straight line rather than in a curved manner. The markers 711, 721 of the second plate 78 are matched to the markers 710, 720 of the first plate 76 in that a spatial ordering of the first plurality of markers 711 and the second plurality of markers 721 in a longer dimension of the marker region 72 is the same as a spatial ordering of the first plurality of markers 710 and the second plurality of markers 720 in a longer dimension of the marker region 71. In particular, the markers 711, 721 of the second plate 78 are matched to the markers 710, 720 of the first plate 76 in that the positions of the markers in the x-direction are matched (for example, taking into account any reduction factor applied by the imaging system). As such, when the first plate 76 is illuminated in the first plane, the image of each of the first plurality of markers 710, 720 is aligned with (i.e. coincides with) a corresponding one of the second plurality of markers 711, 721 in the x-direction. However, the image of some of the first plurality of markers 710, 720 may be misaligned with the corresponding one of the second plurality of markers 711, 721 in the y-direction. As such, a small relative movement (e.g. scanning or stepping) of the plates 76, 78 in the y-direction may be required in order for an image of every one of the first plurality of markers 710, 720 to be formed on a corresponding one of the second plurality of markers 711, 721. Because such movement is small (e.g. compared to the size of the marker region), the movement may be performed quickly, enabling near-simultaneous illumination of each of the markers, despite illumination not being exactly simultaneous.

In an alternative arrangement, the markers 710, 720 of the first plate 76 may be arranged in a straight line rather than in a curved manner, and the markers 711, 721 of the second plate 78 may be arranged in a curved manner. In addition, in general, the radius of curvature of each of the two plates 76, 78 may be different. For example the markers 710, 720 of the first plate 76 may be arranged with a first radius of curvature and the markers 711, 721 of the second plate 78 may be arranged with a second, different, radius of curvature.

Figure 8:
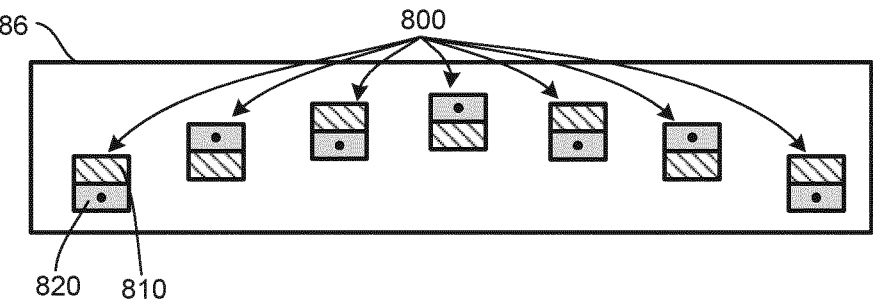
FIG. 8 depicts an alternative arrangement of markers on a plate.

FIG. 8 depicts an alternative arrangement of markers on a plate 86. The plate 86 may be used at one field plane (for example the wafer plane) of an imaging system, in combination with a corresponding plate positioned at another field plane of the imaging system (for example the reticle plane). The corresponding plate may be any other plate described herein. For example, the plate 86 may be positioned at the wafer plane of an imaging system and a corresponding plate from one of the plate systems 40, 50, 60 described with reference to FIGS. 4, 5 and 6 may be positioned at the reticle plane of the imaging system.

The plate 86 comprises a plurality of markers 800 which are arranged at a plurality of locations. The markers 800 are generally arranged, with respect to a marker region and an illumination region, as described previously for other plates. The markers 800 illustrated in FIG. 8 are arranged so as to generally match the locations (e.g. the set of first, second, and optionally third locations) of markers of the plates of the plate systems 40, 50, 60 of FIG. 4, 5 or 6. As such, the markers 800 are arranged in locations that generally match the locations of markers of the corresponding plates of a plate system which the plate 86 is being used with.

Each of the locations on the plate 86 comprises two markers 810, 820, and therefore the markers 800 on the plate may be referred to as dual markers 800. The dual markers 800 each comprise a first type of marker 810 and a second type of marker 820. The first and second type of markers 810, 820 are configured to determine a first or second optical property of an illumination beam, respectively. The plurality of dual markers 800 are arranged such that each marker of a corresponding plate from a plate system in the other plane of the imaging system can be imaged onto a dual marker 800 of the plate 86. In particular, the plurality of dual markers 800 are arranged such that each marker of a corresponding plate from a plate system in the other plane of the imaging system can be imaged onto one of the two markers 810, 820 of a dual marker 800 of the plate 86.

The use of the plate 86 will be described with reference to its use with the plate system 40 of FIG. 4 (i.e. such that the plates 46, 48 comprise the corresponding plate). However, it should be understood that this use is illustrative in nature and the plate 86 may be used in a similar manner with any other corresponding plate (or set of corresponding plates).

A spatial ordering of the first plurality of markers 410 and the second plurality of markers 420 on the first plate 46 shown in FIG. 4 (in a longer dimension of the first plate 46) is the same as a spatial ordering of the first 810 and the second 820 types of markers from the upper markers of the dual markers 800 on the plate 86 shown in FIG. 8 (in a longer dimension of the plate 86). Similarly, a spatial ordering of the first plurality of markers 430 and the second plurality of markers 440 on the second plate 48 shown in FIG. 4 (in a longer dimension of the first plate 48) is the same as a spatial ordering of the first 810 and the second 820 types of markers from the lower markers of the dual markers 800 on the plate 86 shown in FIG. 8 (in a longer dimension of the plate 86).

A first measurement may be taken using the first plate 46 of the plate system 40 as the corresponding plate (i.e. a first corresponding plate 46). The first corresponding plate 46 is positioned in a first plane of the imaging system and illuminated, and the plate 86 is positioned in a second plane of the imaging system. An image of the first subset of markers 410 is formed at a set of first locations on the plate 86 which correspond to a first subset of the dual markers 800. In particular, an image of the first subset of markers 410 is formed at a set of first locations on the plate 86 which correspond to an upper marker 810 of each of the first subset of dual markers 800 in FIG. 8. The radiation received by each marker 810 from this first subset of the dual markers 800 therefore interacts with the portion of the dual marker 800 corresponding to the first type of marker 810 in a manner such that, when the radiation is received by a detector, the first optical property can be determined for the set of first locations. Similarly, an image of the second subset of markers 420 is formed at a set of second locations on the plate 86 which correspond to a second subset of the dual markers 800. In particular, an image of the second subset of markers 420 is formed at a set of second locations on the plate 86 which correspond to an upper marker 820 of each of the second subset of dual markers 800 in FIG. 8. The radiation received by each marker 820 from this second subset of the dual markers 800 therefore interacts with the portion of the dual marker 800 corresponding to the second type of marker 820 in a manner such that, when the radiation is received by a detector, the first optical property can be determined for the set of first locations.

A second measurement may be taken using the second plate 48 of the plate system 40 as the corresponding plate (i.e. a second corresponding plate 48). The second corresponding plate 48 is positioned in the first plane of the imaging system and illuminated, and the plate 86 is positioned in a second plane of the imaging system. An image of the first subset of markers 430 is formed at a set of second locations on the plate 86 which correspond to a lower marker 810 of the second subset of the dual markers 800 in FIG. 8. The radiation received by each marker 810 from the second subset of the dual markers 800 therefore interacts with the portion of the dual marker 800 corresponding to the first type of marker 810 in a manner such that, when the radiation is received by a detector, the first optical property can be determined for the set of first locations. Similarly, an image of the second subset of markers 440 is formed at a set of first locations on the plate 86 which correspond to the first subset of the dual markers 800. In particular, an image of each of the second subset of markers 440 is formed at a lower marker 820 of one of the first subset of the dual markers 800. The radiation received by each marker 800 from the first subset of dual markers 800 therefore interacts with the portion of the dual marker 800 corresponding to the second type of marker 820 in a manner such that, when the radiation is received by the detector, the second optical property can be determined for the first set of locations.

In either measurement (that is, when the first corresponding plate 46 or the second corresponding plate 48 is used in the first plane), the same plate 86 may be used in the second plane while still enabling the aforementioned benefits of the plate systems described herein. Furthermore, using the same plate 86 may enable the plate 86 to be easily affixed to a detector (for example, while minimizing a size of the detector). Each dual marker 800 may enable the propagation of radiation from the marker 800 to a detecting portion of a corresponding detector. Having a single plate 86 affixed to a detector enables the detection of one or more optical properties using multiple corresponding plates (for example at reticle level), without requiring the exchange of plates associated with the detector and/or relative movement between the detector and its associated plate. Using a single plate 86 may enable a time saving (e.g. as time is not spent alternating between plates at the second plane). Using a single plate 86 may result in a more robust determination, for example as there are fewer moving parts since fewer parts (e.g. plates) result in less exchange or movement.

Each portion of the dual markers 800 (i.e. the portions corresponding to the first and second types of marker 810, 820) may be considered to be located at substantially the same location on the plate 86. In particular, each portion of each dual markers 800 (i.e. the portions corresponding to the first and second types of marker 810, 820) may be considered to be located at substantially the same location on the plate 86 in a direction of a longer dimension of the plate 86 (which may correspond to a non-scanning direction of an imaging system using the plate 86). As such, each dual marker 800 may be considered to sample a single field point, with respect to the field points sampled by the corresponding plate. It will be understood that, in practice, the first and second types of marker 810, 820 may have some spatial separation, for example in a direction of a shorter dimension of the plate 86. However, a distance between the first and second types of marker 810, 820 of each dual marker 800 is small, especially in comparison with a distance between adjacent dual markers 800. For example, the distance between a first and second type of marker 810, 820 of each dual marker 800 may be on the order of 10 to 100 times smaller than a distance between adjacent dual markers 800.

When a plate with dual markers (e.g. the plate 86 of FIG. 8) is used in combination with a corresponding plate with blanks (e.g. a plate of the plate system of FIG. 5 or 6), the plate with dual markers may have no blanks. However, the plate with dual markers may be considered generally matched to the corresponding plate as each of the markers (e.g. of the first and/or second type) may still correspond to a position of a dual marker of the plate with dual markers. Furthermore, the beneficial effect of reducing contamination propagating through the imaging system is still achieved through the use of a single plate with blanks (e.g. in a first plane), even though the second plate (e.g. in the second plane) comprises no blanks.

Specific example arrangements of imaging systems, plates and plate systems have been described herein. However, it should be understood that features of different arrangements (for example relating to arrangement, marker type, implementation) may be combined.

Specific reference has been made herein to the use of gratings to determine an aberration map and pinholes to determine an angular distribution. However, many types of marker will be known to the skilled person and it should be understood that different markers may be used to determine an aberration map and/or angular distribution, and that other optical properties may be determined by appropriate selection of marker type. Other examples of markers which may be used are slits, or arrays of pinholes, or polarizers to measure polarization of radiation in the illumination beam. In implementations where the polarization of the radiation is measured, the optical property in question may be a polarization of the illumination beam.

The gratings depicted in the Figures are schematically depicted as featuring a single grating in a single orientation. However, gratings may be used which comprise different patterned regions with different orientations. For example, a grating may comprise a first patterned region aligned in a first direction and a second patterned region aligned in a second direction perpendicular to the first direction. The first and second direction may be angled at approximately 45° relative to the x-direction and y-direction (e.g. the scanning direction and non-scanning direction). Illumination of the first patterned region may provide information related to aberrations in a first direction and illumination of the second patterned region may provide information related to aberrations in a second direction.

In order to perform a determination of aberrations which are caused by the projection system, a mode of the illumination system may be changed. For example, during normal operation of a lithographic apparatus, the illumination system may be configured to illuminate an in-use illumination region of the first plane. However the mode of the illumination system may be changed such that a measurement illumination region of the first plane is illuminated. In such instances, the marker region may correspond to the measurement illumination region.

Additionally or alternatively to applying a reduction factor, the projection system may rotate and/or mirror and/or distort the image of the first plane formed in the second plane. In such instances, the second plate positionable in the second plane is matched to the first plate positionable in the first plane such that any rotation and/or mirroring and/or distortion is factored into the arrangement of markers (and optionally blanks) on the second plate.

In some implementations, the illumination beam, plates and/or detector may be sequentially scanned and/or stepped. The stepping may be in a direction which is perpendicular to the alignment of a diffraction grating which is being illuminated. The stepping may be by a distance which corresponds with a fraction of the grating period of the gratings. Measurements which are made at different stepping positions may be analysed in order to derive information about a wavefront in the stepping direction. Stepping may be performed in two perpendicular directions which allows for information about a wavefront to be derived in two perpendicular directions (in particular, it provides information about a derivative of the wavefront in each of the two perpendicular directions), thereby allowing the full wavefront to be reconstructed. Such stepping is not to be considered as a substantial movement of the illumination beam, plates and/or detector. For example, the stepping distances are small compared to the size of the marker region and is not comparable to moving the illumination beam and/or plate such that a different marker region is illuminated.

The illustrated arrangements of markers comprise four or seven markers (and optionally blanks). However, it should be understood that any number of markers may be used, for example two (one of each type of marker) or thirty. Furthermore, the illustrated arrangements of markers comprise markers arranged in a single line (albeit a curved line). In alternative arrangements, the markers may be arranged in multiple lines or generally dispersed over a region. For example, in an imaging system where the illumination region is not elongate, the markers may be generally disposed around the edges and inner extent of a marker region which corresponds to the illumination region. In a non-limiting example, for an illumination region which is circular, the markers may be arranged within a circular marker region in concentric circles.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention or example implementations in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific illustrative examples of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

CLAUSES

1. An imaging system comprising:
   a first plane configured to receive an illumination beam in a first region;
   a second plane configured to receive, in a second region of the second plane, an image of the first region;
   a first plate comprising a first plurality of markers, wherein:
      a first subset of the first plurality of markers comprises a first type of markers for determining a first optical property of the illumination beam;
      a second subset of the first plurality of markers comprises a second type of markers for determining a second optical property of the illumination beam; and
      the first plate is positionable in the first plane such that the first plurality of markers are located within the first region;
   a second plate comprising a second plurality of markers, wherein:
      a first subset of the second plurality of markers comprises a first type of markers for determining the first optical property of the illumination beam;
      a second subset of the second plurality of markers comprises a second type of markers for determining the second optical property of the illumination beam;
      the arrangement of the second plurality of markers generally matches the arrangement of the first plurality of markers; and
      the second plate is positionable in the second plane such that the second plurality of markers are located within the second region; and
   a detector positionable in a third plane and operable to:
      receive radiation from the second plate when the second plate is disposed in the second region; and
      output a signal indicative of the first and/or second optical properties of the illumination beam.
2. The imaging system of clause 1, wherein the arrangement of the second plurality of markers generally matches the arrangement of the first plurality of markers such that, when the first plate is disposed in the first region and the second plate is disposed in the second region, an image of each of the first plurality of markers coincides with a corresponding one of the second plurality of markers in a first direction.
3. The imaging system of clause 1 or clause 2, wherein the arrangement of the second plurality of markers generally matches the arrangement of the first plurality of such that, when the first plate is disposed in the first region and the second plate is disposed in the second region, an image of each of the first plurality of markers coincides with a corresponding one of the second plurality of markers.
4. The imaging system of any preceding clause, wherein the first optical property is an aberration map of the illumination beam and wherein each of the first type of markers comprises a grating.
5. The imaging system of any preceding clause, wherein the second optical property is an angular distribution of the illumination beam at the first region and wherein each of the second type of markers comprises a pinhole.

6. The imaging system of any preceding clause, further comprising:
   a third plurality of markers positionable in the first plane, wherein:
      a first subset of the third plurality of markers comprises a first type of markers for determining a first optical property of the illumination beam;
      a second subset of the third plurality of markers comprises a second type of markers for determining a second optical property of the illumination beam;
      the third plurality of markers are simultaneously positionable within the first region; and
      the configuration of the third plurality of markers is different to the configuration of the first plurality of markers; and
   a fourth plurality of markers positionable in the second plane, wherein:
      a first subset of the fourth plurality of markers comprises a first type of markers for determining a first optical property of the illumination beam;
      a second subset of the fourth plurality of markers comprises a second type of markers for determining a second optical property of the illumination beam;
      the fourth plurality of markers are positionable within the second region; and
      the arrangement of the fourth plurality of markers generally matches the arrangement of the third plurality of markers.
7. The imaging apparatus of clause 6, wherein:
   the first plate further comprises the third plurality of markers, the first plate being further positionable such that the third plurality of markers are located within the first region; and
   the second plate further comprises the fourth plurality of markers, the second plate being further positionable such that the fourth plurality of markers are located within the second region.
8. The imaging apparatus of clause 6, further comprising:
   a third plate comprising the third plurality of markers, the third plate positionable in the first plane such that the third plurality of markers are located within the first region; and
   a fourth plate comprising the fourth plurality of markers, the fourth plate positionable in the second plane such that the fourth plurality of markers are located within the second region.
9. A lithographic apparatus comprising the imaging apparatus of any preceding clause and further comprising:
   an illumination system operable to illuminate the first region with an illumination beam; and
   a projection system operable to form an image of the first region at the second region.
10. A method of determining one or more optical properties of the imaging system of any of clauses 1 to 8, the method comprising:
   positioning the first plate in the first plane such that the first plurality of markers are located within the first region;
   positioning the second plate in the second plane such that the second plurality of markers are located within the second region;
   illuminating the first region with an illumination beam;
   receiving, with the detector, radiation from the second plate;

receiving, from the detector, the signal indicative of the first and/or second optical properties of the illumination beam; and determining the first and/or second optical properties of the illumination beam based on the signal.

11. A plate for use in an imaging system to determine two optical properties of an illumination beam of the imaging system, the imaging system configured to illuminate an illumination region with the illumination beam, the plate comprising a plurality of markers, wherein:

a first subset of the plurality of markers comprises a first type of markers for determining a first optical property of the illumination beam;

a second subset of the plurality of markers comprises a second type of markers for determining a second optical property of the illumination beam; and the plurality of markers are located within a marker region of the plate; and the marker region generally corresponds to the illumination region.

12. The plate of clause 11, wherein each of the first type of markers comprises a grating.

13. The plate of clause 11 or 12, wherein each of the second type of markers comprises a pinhole.

14. The plate of any of clauses 11 to 13, wherein the marker region is elongate.

15. The plate of any of clauses 11 to 14, wherein a first marker of the plurality of markers is located at, or proximate to, a first end of the marker region, a second marker of the plurality of markers is located at, or proximate to, a second end of the marker region distal to the first end, and the other markers of the plurality of markers are distributed between the first and second marker.

16. The plate of any of clauses 11 to 15, wherein adjacent markers of the plurality of markers alternate between the first type of marker and the second type of marker.

17. A plate system for use in an imaging system to determine two optical properties of an illumination beam of the imaging system, the imaging system configured to illuminate an illumination region with the illumination beam, the plate system comprising a first plate and second plate each according to any of clauses 11 to 16, wherein:

on the first plate, the first subset of the plurality of markers are located at a set of first locations and the second subset of the plurality of markers are located at a set of second locations;

on the second plate, the first subset of the plurality of markers are located at a set of second locations and the second subset of the plurality of markers are located at a set of first locations;

the first locations of the first plate correspond to the first locations of the second plate and the second locations of the first plate correspond to the second locations of the second plate.

18. A plate system for use in an imaging system to determine two optical properties of an illumination beam of the imaging system, the plate system comprising a first plate, a second plate, and a third plate each according to any of clauses 11 to 16, wherein:

on the first plate, the first subset of the plurality of markers are located at a set of first locations, the second subset of the plurality of markers are located at a set of second locations;

the first plate further comprises a set of third locations which comprise no markers;

on the second plate, the first subset of the plurality of markers are located at a set of second locations and the second subset of the plurality of markers are located at a set of third locations;

the second plate further comprises a set of first locations which comprise no markers;

on the third plate, the first subset of the plurality of markers are located at a set of third locations, the second subset of the plurality of markers are located at a set of first locations;

the third plate further comprises a set of second locations which comprise no markers;

the first locations of the first plate correspond to the first locations of the second plate and the first locations of the third plate;

the second locations of the first plate correspond to the second locations of the second plate and the second locations of the third plate; and the third locations of the first plate correspond to the third locations of the second plate and the third locations of the third plate.

19. A plate system for use in an imaging system to determine an optical property of an illumination beam of the imaging system, the imaging system configured to illuminate an illumination region with the illumination beam, the plate system comprising:

a first plate comprising:

a first plurality of markers for determining the optical property of the illumination beam, the first plurality of markers located at a set of first locations; and a set of second locations which comprise no markers;

a second plate comprising:

a second plurality of markers for determining the optical property of the illumination beam, the second plurality of markers located at a set of second locations which correspond to the set of second locations of the first plate; and a set of first locations which comprise no markers; and wherein the set of first locations of the second plate corresponds to the set of first locations of the first plate; and wherein the first plurality of markers are located in a first marker region which generally corresponds to the illumination region; and wherein the second plurality of markers are located in a second marker region which generally corresponds to the illumination region.

20. A reticle stage for holding a reticle, the reticle stage comprising the plate or plate system of any of clauses 11 to 19.

21. A substrate stage for holding a substrate, the substrate stage comprising the plate of any of clauses 11 to 19.

22. A detector comprising the plate of any of clauses 11 to 19.

The invention claimed is:

1. An imaging system comprising:

a first plane configured to receive an illumination beam in a first region;

a second plane configured to receive, in a second region of the second plane, an image of the first region;

a first plate comprising a first plurality of markers, wherein:

a first subset of the first plurality of markers comprises a first type of markers for determining a first optical property of the illumination beam;

41 a second subset of the first plurality of markers comprises a second type of markers for determining a second optical property of the illumination beam, the second type of markers having a different form than the first type of markers; and the first plate is positionable in the first plane such that the first plurality of markers are located within the first region;

a second plate comprising a second plurality of markers, wherein:

a first subset of the second plurality of markers comprises a first type of markers for determining the first optical property of the illumination beam;

a second subset of the second plurality of markers comprises a second type of markers for determining the second optical property of the illumination beam;

the arrangement of the second plurality of markers generally matches the arrangement of the first plurality of markers; and the second plate is positionable in the second plane such that the second plurality of markers are located within the second region; and a detector positionable in a third plane and operable to:

receive radiation from the second plate when the second plate is disposed in the second region; and output a signal indicative of the first optical property and/or second optical property of the illumination beam.

2. The imaging system of claim 1, wherein the arrangement of the second plurality of markers generally matches the arrangement of the first plurality of markers such that, when the first plate is disposed in the first region and the second plate is disposed in the second region, an image of each of the first plurality of markers coincides with a corresponding one of the second plurality of markers in a first direction.

3. The imaging system of claim 1, wherein the arrangement of the second plurality of markers generally matches the arrangement of the first plurality of markers such that, when the first plate is disposed in the first region and the second plate is disposed in the second region, an image of each of the first plurality of markers coincides with a corresponding one of the second plurality of markers.

4. The imaging system of claim 1, wherein the first optical property is an aberration map of the illumination beam and wherein each of the first type of markers comprises a grating or/and wherein the second optical property is an angular distribution of the illumination beam at the first region and wherein each of the second type of markers comprises a pinhole.

5. The imaging system of claim 1, further comprising:

a third plurality of markers positionable in the first plane, wherein:

a first subset of the third plurality of markers comprises a first type of markers for determining the first optical property of the illumination beam;

a second subset of the third plurality of markers comprises a second type of markers for determining the second optical property of the illumination beam;

the third plurality of markers are simultaneously positionable within the first region; and the configuration of the third plurality of markers is different to the configuration of the first plurality of markers; and a fourth plurality of markers positionable in the second plane, wherein:

a first subset of the fourth plurality of markers comprises a first type of markers for determining the first optical property of the illumination beam;

a second subset of the fourth plurality of markers comprises a second type of markers for determining the second optical property of the illumination beam;

the fourth plurality of markers are positionable within the second region; and the arrangement of the fourth plurality of markers generally matches the arrangement of the third plurality of markers.

6. The imaging apparatus of claim 5, wherein:

the first plate further comprises the third plurality of markers, the first plate being further positionable such that the third plurality of markers are located within the first region; and the second plate further comprises the fourth plurality of markers, the second plate being further positionable such that the fourth plurality of markers are located within the second region.

7. The imaging apparatus of claim 5, further comprising:

a third plate comprising the third plurality of markers, the third plate positionable in the first plane such that the third plurality of markers are located within the first region; and a fourth plate comprising the fourth plurality of markers, the fourth plate positionable in the second plane such that the fourth plurality of markers are located within the second region.

8. A lithographic apparatus comprising:

the imaging apparatus of claim 1;

an illumination system operable to illuminate the first region with an illumination beam; and a projection system operable to form an image of the first region at the second region.

9. A method of determining one or more optical properties of the imaging system of claim 1, the method comprising:

positioning the first plate in the first plane such that the first plurality of markers are located within the first region;

positioning the second plate in the second plane such that the second plurality of markers are located within the second region;

illuminating the first region with an illumination beam;

receiving, with the detector, radiation from the second plate;

receiving, from the detector, the signal indicative of the first optical property and/or second optical property of the illumination beam; and determining the first optical property and/or second optical property of the illumination beam based on the signal.

10. The imaging system of claim 1, wherein the first optical property is an aberration map of the illumination beam and wherein each of the first type of markers comprises a grating.

11. The imaging system of claim 1, wherein the second optical property is an angular distribution of the illumination beam at the first region and wherein each of the second type of markers comprises a pinhole.

12. A plate for use in an imaging system to determine at least two optical properties of an illumination beam of the imaging system, the imaging system configured to illuminate an illumination region with the illumination beam, the plate comprising a plurality of markers, wherein:

a first subset of the plurality of markers comprises a first type of markers for determining a first optical property of the illumination beam;

a second subset of the plurality of markers comprises a second type of markers for determining a second optical property of the illumination beam, the second type of markers having a different form than the first type of markers; and the plurality of markers are located within a marker region of the plate; and the marker region generally corresponds to the illumination region.

13. The plate of claim 12, wherein a first marker of the plurality of markers is located at, or proximate to, a first end of the marker region, a second marker of the plurality of markers is located at, or proximate to, a second end of the marker region distal to the first end, and the other markers of the plurality of markers are distributed between the first and second markers.

14. The plate of claim 12, wherein adjacent markers of the plurality of markers alternate between the first type of marker and the second type of marker.

15. A plate system for use in an imaging system to determine at least two optical properties of an illumination beam of the imaging system, the imaging system configured to illuminate an illumination region with the illumination beam, the plate system comprising a first plate and second plate each according to claim 12, wherein:

on the first plate, the first subset of the plurality of markers are located at a set of first locations and the second subset of the plurality of markers are located at a set of second locations;

on the second plate, the first subset of the plurality of markers are located at a set of second locations and the second subset of the plurality of markers are located at a set of first locations;

the first locations of the first plate correspond to the first locations of the second plate and the second locations of the first plate correspond to the second locations of the second plate.

16. A plate system for use in an imaging system to determine at least two optical properties of an illumination beam of the imaging system, the plate system comprising a first plate, a second plate, and a third plate each according to claim 12, wherein:

on the first plate, the first subset of the plurality of markers are located at a set of first locations and the second subset of the plurality of markers are located at a set of second locations;

the first plate further comprises a set of third locations which comprise no markers;

on the second plate, the first subset of the plurality of markers are located at a set of second locations and the second subset of the plurality of markers are located at a set of third locations;

the second plate further comprises a set of first locations which comprise no markers;

on the third plate, the first subset of the plurality of markers are located at a set of third locations and the second subset of the plurality of markers are located at a set of first locations;

the third plate further comprises a set of second locations which comprise no markers;

the first locations of the first plate correspond to the first locations of the second plate and the first locations of the third plate;

the second locations of the first plate correspond to the second locations of the second plate and the second locations of the third plate; and the third locations of the first plate correspond to the third locations of the second plate and the third locations of the third plate.

17. The plate of claim 12, wherein each of the first type of markers comprises a grating.

18. The plate of claim 17, wherein each of the second type of markers comprises a pinhole.

19. The plate of claim 12, wherein the marker region is elongate.

20. A plate system for use in an imaging system to determine an optical property of an illumination beam of the imaging system, the imaging system configured to illuminate an illumination region with the illumination beam, the plate system comprising:

a first plate comprising:

at least three first markers for determining the optical property of the illumination beam, the at least three first markers located at a set of first locations; and a set of second locations which comprise no markers;

a second plate comprising:

a plurality of second markers for determining the optical property of the illumination beam, the plurality of second markers located at a set of second locations which correspond to the set of second locations of the first plate; and a set of first locations which comprise no markers, wherein the set of first locations of the second plate corresponds to the set of first locations of the first plate; and wherein the at least three first markers are located in a first marker region which generally corresponds to the illumination region such that the at least three first markers are illuminated together by the illumination beam; and wherein the plurality of second markers are located in a second marker region which generally corresponds to the illumination region.

* * * * *